(12) United States Patent
Shimauchi et al.

(10) Patent No.: US 9,400,194 B2
(45) Date of Patent: Jul. 26, 2016

(54) MAGNETIC DETECTION DEVICE AND ON-VEHICLE ROTATION DETECTION DEVICE EQUIPPED WITH THE SAME

(71) Applicant: Mitsubishi Electric Corporation, Chiyoda-ku, Tokyo (JP)

(72) Inventors: Hideki Shimauchi, Chiyoda-ku (JP); Masahiro Yokotani, Chiyoda-ku (JP); Takafumi Hara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 14/260,740

(22) Filed: Apr. 24, 2014

(65) Prior Publication Data

US 2015/0115941 A1   Apr. 30, 2015

(30) Foreign Application Priority Data

Oct. 29, 2013   (JP) ................. 2013-223889

(51) Int. Cl.
*G01B 7/30* (2006.01)
*G01R 33/09* (2006.01)
*G01D 5/16* (2006.01)
(Continued)

(52) U.S. Cl.
CPC .................. *G01D 5/16* (2013.01); *G01D 5/145* (2013.01); *G01D 5/2451* (2013.01); *G01R 33/093* (2013.01); *G01R 33/098* (2013.01)

(58) Field of Classification Search
CPC ........................................................ G01B 7/30
USPC .................................................... 324/207.25
See application file for complete search history.

(56) References Cited

U.S. PATENT DOCUMENTS 4,401,944 A   8/1983   Narimatsu et al.
5,373,238 A   12/1994   McGuire et al.
(Continued)

FOREIGN PATENT DOCUMENTS

DE          31 06 613 A1    12/1981
DE   10 2012 201 348 A1     8/2012
(Continued)

OTHER PUBLICATIONS

Communication dated Jul. 31, 2015, issued by the German Patent and Trademark Office in corresponding German Application No. 10 2014 214 677.1.

(Continued)

*Primary Examiner* — Bot Ledynh
(74) *Attorney, Agent, or Firm* — Sughrue Mion, PLLC

(57) ABSTRACT

Rotation of a magnetized rotor is detected in a highly accurate manner without depending on a magnetic pole pitch of N and S poles of the magnetized rotor. To that end, a magnetic detection device includes a magnetoresistive element that is formed of a fixed layer made of a ferromagnetic material whose magnetization direction is fixed and a free layer made of a ferromagnetic material whose magnetization direction can be freely changed, with a non-magnetic middle layer sandwiched between the layers, and arranged therein maintaining a gap between the element and the outer circumferential surface of the magnetized rotor in which the N and S poles are alternately arranged along the outer circumference rotating around a rotation shaft, wherein the magnetoresistive element is arranged in such a way that a plane on which the fixed layer is formed is in a plane including the rotation shaft.

6 Claims, 35 Drawing Sheets

(51) Int. Cl.
*G01D 5/14* (2006.01)
*G01D 5/245* (2006.01)

(56) References Cited

U.S. PATENT DOCUMENTS

| | | | |
|---|---|---|---|
| 6,147,487 A * | 11/2000 | Sugitani | 324/207.21 |
| 6,559,638 B1 * | 5/2003 | Adelerhof | 324/207.21 |
| 7,199,985 B1 | 4/2007 | Sato et al. | |
| 2003/0137381 A1 | 7/2003 | Toyoda et al. | |
| 2012/0194175 A1 | 8/2012 | Ausserlechner | |

FOREIGN PATENT DOCUMENTS

| | | | |
|---|---|---|---|
| JP | 7142783 A | 6/1995 |
| JP | 10-010141 A | 1/1998 |
| JP | 11-108689 A | 4/1999 |
| JP | 200623179 A | 1/2006 |
| JP | 4104748 B2 | 6/2008 |
| JP | 4132835 B2 | 8/2008 |
| JP | 2009186410 A | 8/2009 |
| JP | 2009-300143 A | 12/2009 |
| JP | 2012127736 A | 7/2012 |
| JP | 5144373 B2 | 2/2013 |

OTHER PUBLICATIONS

Communication dated Oct. 28, 2014, issued by the Japan Patent Office in corresponding Japanese Application No. 2013-223889.

* cited by examiner

⟺ MAGNETIZATION DIRECTION
OF FIXED LAYER

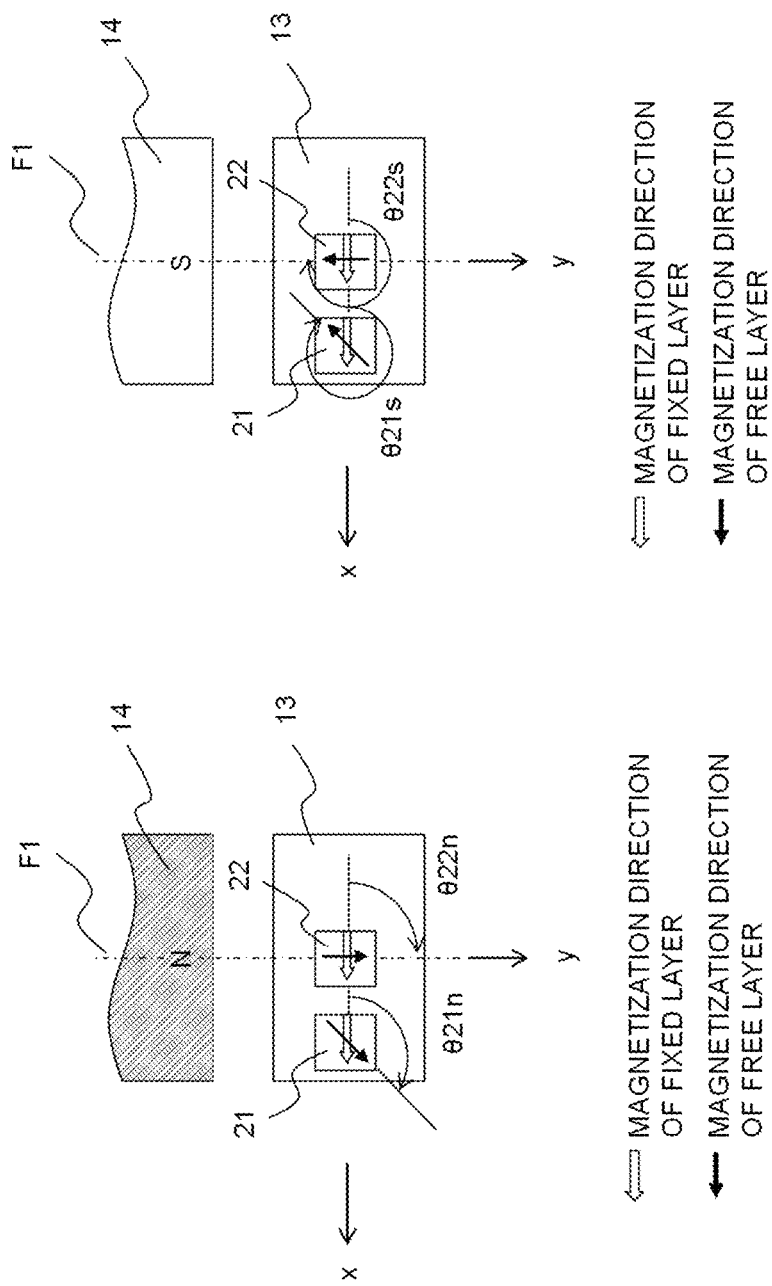

⇐ MAGNETIZATION DIRECTION OF FIXED LAYER

MAGNETIC DETECTION DEVICE AND ON-VEHICLE ROTATION DETECTION DEVICE EQUIPPED WITH THE SAME

BACKGROUND OF THE INVENTION

1. Field of the Invention

The present invention relates to magnetic detection devices, and in particular relates to a device that detects a direction of a magnetic field changing with time by rotation etc., for example, one that detects a rotation speed and rotation angle of a rotating body.

2. Description of the Related Art

A conventional technology is disclosed in, for example, Japanese Laid-open Patent Publication No. H11-108689. The device that detects rotation of a rotating body is configured in such a way that a magnetized rotor that is magnetized to N and S poles alternately arranged along the outer circumferential surface thereof is rotated with the rotating body, and the number of changes in magnetic field caused by the rotation is detected. The magnetized rotor is made rotatable circumferentially by a rotor shaft. For example, the magnetized rotor shaft is assembled to an engine crank shaft or an axle so as to rotate with the crank shaft or the axle in an integrated manner.

It is also described there to use a magnetoresistive element as a detection element and detect changes in magnetic flux passing through the detection element when the magnetized rotor rotates. The magnetoresistive element shown in Japanese Laid-open Patent Publication No. H11-108689 is a tunneling junction magnetoresistive element (TMR element). As shown in FIG. 31, the TMR element includes a fixed layer 6 made of a ferromagnetic material whose magnetization direction is fixed, a non-magnetic middle layer 8 made of a non-magnetic material and a free layer 7 made of a ferromagnetic material whose magnetization direction can be freely changed by an external magnetic field, and is enabled to detect changes in magnetoresistance based on changes in the value of a current flowing across the layers depending on a magnetic field at a position where the element is arranged.

FIG. 31 shows variations in resistance value when an external magnetic field is applied that is parallel to the magnetization direction of the fixed layer 6 of the TMR element, which is the magnetoresistive element. When a parallel magnetic field greater than a certain value with respect to the magnetization direction of the fixed layer 6 is applied, the resistance value of the magnetoresistive element varies toward its minimum value and is then saturated. Whereas, when an antiparallel magnetic field greater than a certain value is applied, the resistance value of the magnetoresistive element varies toward its maximum value and is then saturated. FIG. 32 shows how the resistance value varies when a magnetic field saturating the magnetoresistive element shown in FIG. 31 is applied to the element and an angle formed with respect to the magnetization direction of the fixed layer 6 is changed. As shown in the figure, the resistance value varies with a period of 360 degrees, depending on the relative angle formed between the magnetization direction of the fixed layer 6 and the applied magnetic field direction (to be the magnetization direction of the free layer 7).

FIG. 33 shows a schematic configuration view of a conventional magnetic detection device equipped with a magnetized rotor and magnetoresistive elements. The reference numerals 1 and 2 denote magnetoresistive elements; the reference numeral 3, a magnetized rotor with a plurality of N and S poles alternately arranged along the outer circumferential surface thereof; the reference numeral 4, a rotation shaft of the magnetized rotor 3; and the reference numeral 5, a circuit substrate mounted with the magnetoresistive elements 1 and 2 or an IC including a processing circuit. A coordinate system is defined as follows: a direction of fixed layers of the magnetoresistive elements 1 and 2 are the y-axis; a direction perpendicular to the fixed layers, the z-axis; and a direction perpendicular to the y-z-plane, the x-axis. The magnetized rotor 3 is disposed in the proximity of the magnetoresistive elements 1 and 2, in the y-axis direction viewed from the magnetoresistive elements 1 and 2. The rotation shaft 4 of the magnetized rotor 3 is made nearly parallel to the z-axis. The magnetoresistive elements 1 and 2 are arranged apart from each other by a certain distance (Le) in the x-axis directions, and the processing circuit shown in FIG. 34 performs waveform shaping.

FIG. 35 shows variations in the resistance values of the magnetoresistive elements 1 and 2 and also a differential output voltage Vc and final output Vo processed by the circuit shown in FIG. 34 when the magnetized rotor 3 is rotated. Since the magnetoresistive elements 1 and 2 are arranged apart from each other by the distance Le in a rotation direction of the magnetized rotor 3 (x-axis direction), the variations in the resistance values of both elements are out of phase with each other by Le. When a magnetic pole pitch P of the magnetized rotor 3 is nearly the same as the distance Le between the magnetoresistive elements 1 and 2, the foregoing differential output voltage becomes nearly sinusoidal.

However, when the magnetic pole pitch P of the magnetized rotor 3 becomes greater than the distance Le between the magnetoresistive elements 1 and 2 as shown in FIG. 36, a magnetic field in the same direction is applied to the magnetoresistive elements 1 and 2, thereby creating periods (A) during which the differential output voltage becomes a constant voltage. The differential output voltage comes close to Vref in these periods as described above; therefore erroneous pulses easily occur in the final output due to disturbance noise. Moreover, since variations in the differential output voltage become gentle, positions of signal rising and falling edges of the final output easily shift, so that detection accuracy would be deteriorated.

In order to avoid the foregoing situation, it is effective to set the distance Le between the magnetoresistive elements 1 and 2 in accordance with the magnetic pole pitch P of the magnetized rotor 3; however, the greater the magnetic pole pitch P of the magnetized rotor 3 is, the longer the distance between the magnetoresistive elements 1 and 2 becomes, thereby increasing the size of the circuit board 5, which will resultantly push up the magnetic detection device costs. In addition, the distance between the magnetoresistive elements 1 and 2 needs to be adjusted for each magnetized rotor.

Furthermore, Japanese Laid-open Patent Publication No. 2009-300143 discloses a magnetic detection device in which a magnetoresistive element is arranged on a substrate parallel to the outer circumferential surface of the magnetized rotor, in a position of the element facing the rotor. Japanese Laid-open Patent Publication No. 2009-300143 also describes the magnetic detection device as diminishing effects of the hysteresis characteristics of the magnetoresistive element by using a DC bias magnetic field. However, according to this magnetic detection device, the magnetoresistive element detects magnetic field components in the directions of the rotation shaft of the magnetized rotor and those in directions perpendicular to radial directions and to the rotation shaft of the magnetized rotor, out of components of the magnetic field the magnetized rotor generates. Therefore, output from the magnetoresistive element becomes nearly sinusoidal, so that the problem with the magnetized rotor pitch cannot be solved, the same as Japanese Laid-open Patent Publication No. H11-108689.

SUMMARY OF THE INVENTION

The present invention aims at solving the foregoing conventional problems and detecting rotation of the magnetized rotor in a highly accurate manner, without depending on the magnetic pole pitch between N and S poles of the magnetized rotor.

According to the present invention, a magnetic detection device includes a magnetoresistive element that is formed of a fixed layer made of a ferromagnetic material whose magnetization direction is fixed and a free layer made of a ferromagnetic material whose magnetization direction can be freely changed, with a non-magnetic middle layer sandwiched between the layers, and arranged therein maintaining a gap between the element and the outer circumferential surface of a magnetized rotor in which N and S poles are alternately arranged along the outer circumference rotating around a rotation shaft, wherein the magnetoresistive element is arranged in such a way that a plane on which the fixed layer is formed is in a plane including the rotation shaft.

The present invention produces an effect of providing a magnetic detection device that can detect rotation of the magnetized rotor in a highly accurate manner, without depending on the magnetic pole pitch between N and S poles of the magnetized rotor.

The foregoing and other object, features, aspects and advantages of the present invention will become more apparent from the following detailed description of the present invention when taken in conjunction with the accompanying drawings.

BRIEF DESCRIPTION OF THE DRAWINGS

FIG. 13A and FIG. 13B are another main-part enlarged views for explaining states when the magnetoresistive elements come close to an N pole and an S pole of the magnetized rotor, respectively, in the magnetic detection device according to Embodiment 3 of the invention;

DETAILED DESCRIPTION OF THE PREFERRED EMBODIMENTS

Embodiment 1

Figure 1:
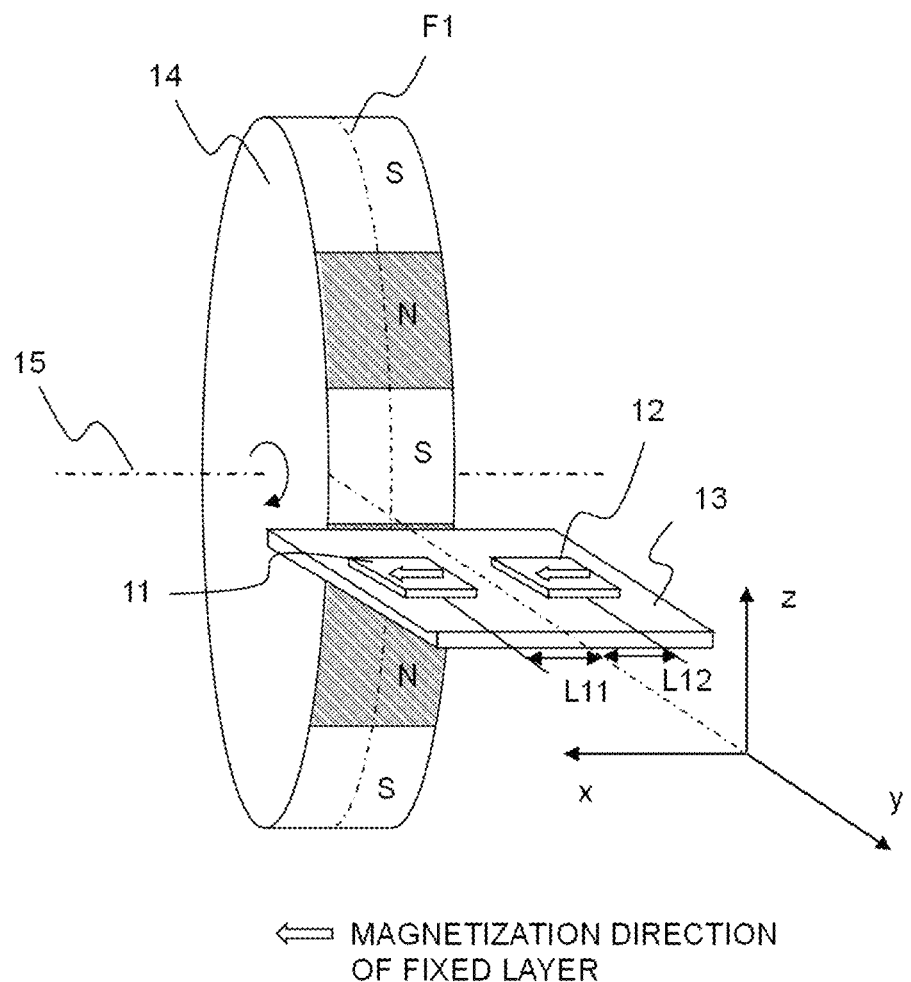
FIG. 1 is a perspective view showing a schematic configuration of a magnetic detection device according to Embodiment 1 of the present invention.
Figure 2:
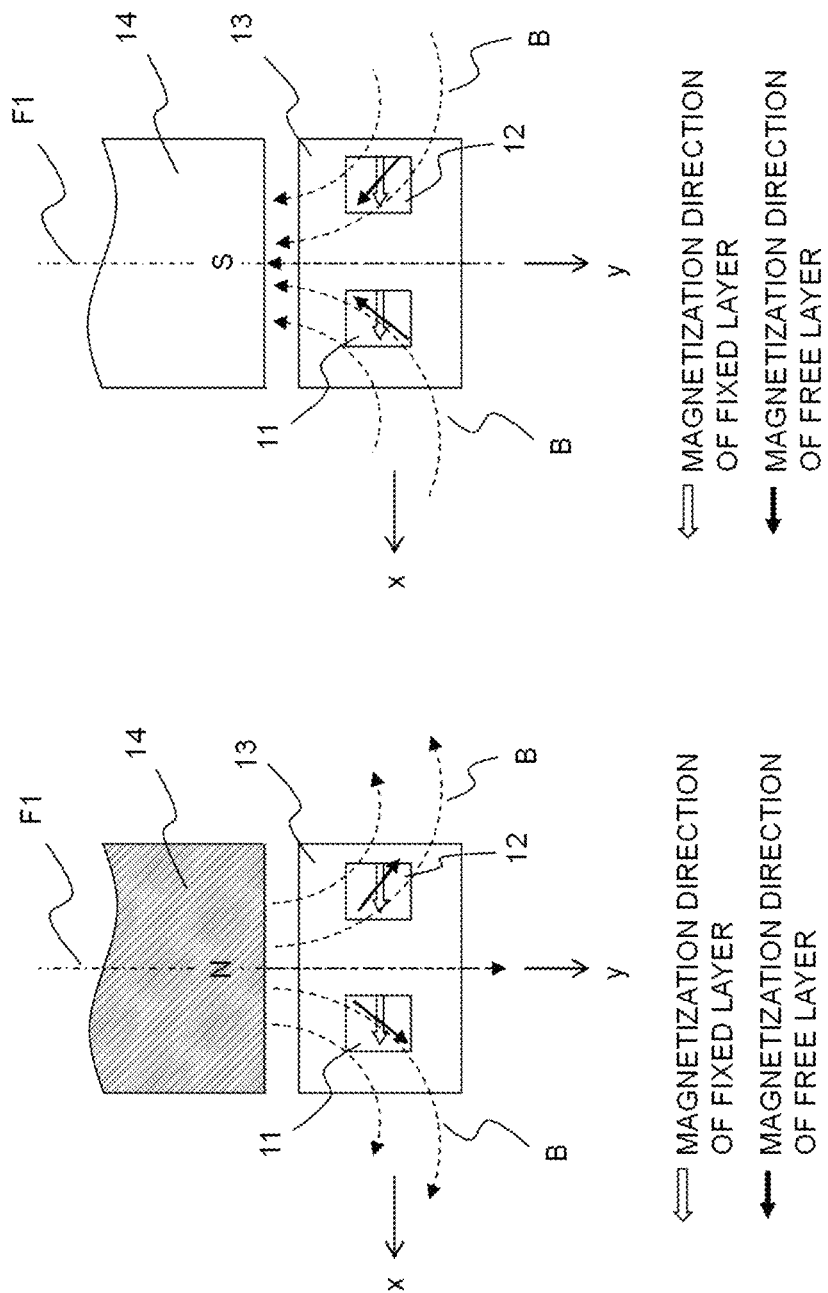
FIG. 2A and FIG. 2B are main-part enlarged views for explaining states when magnetoresistive elements come close to an N pole and an S pole of a magnetized rotor, respectively, in the magnetic detection device according to Embodiment 1 of the invention.
Figure 31:
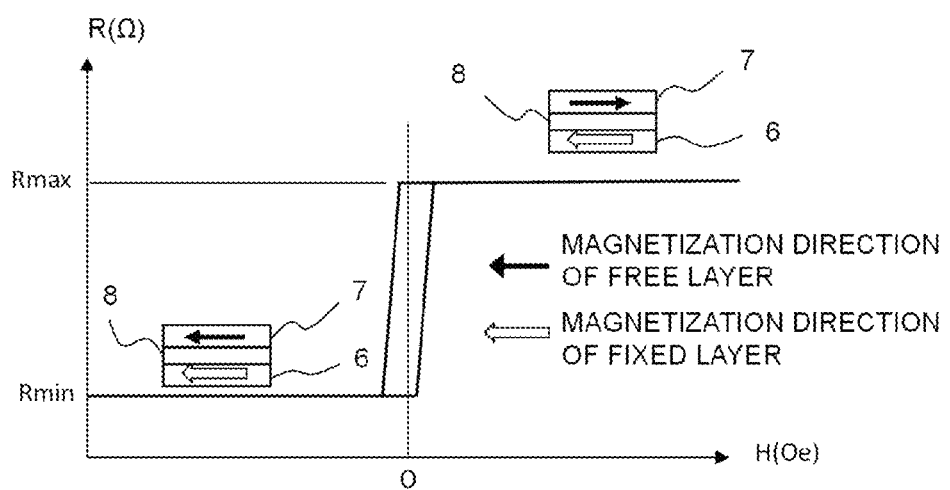
FIG. 31 is a view for explaining the characteristics of a magnetic detection element used for the present invention.
Figure 32:
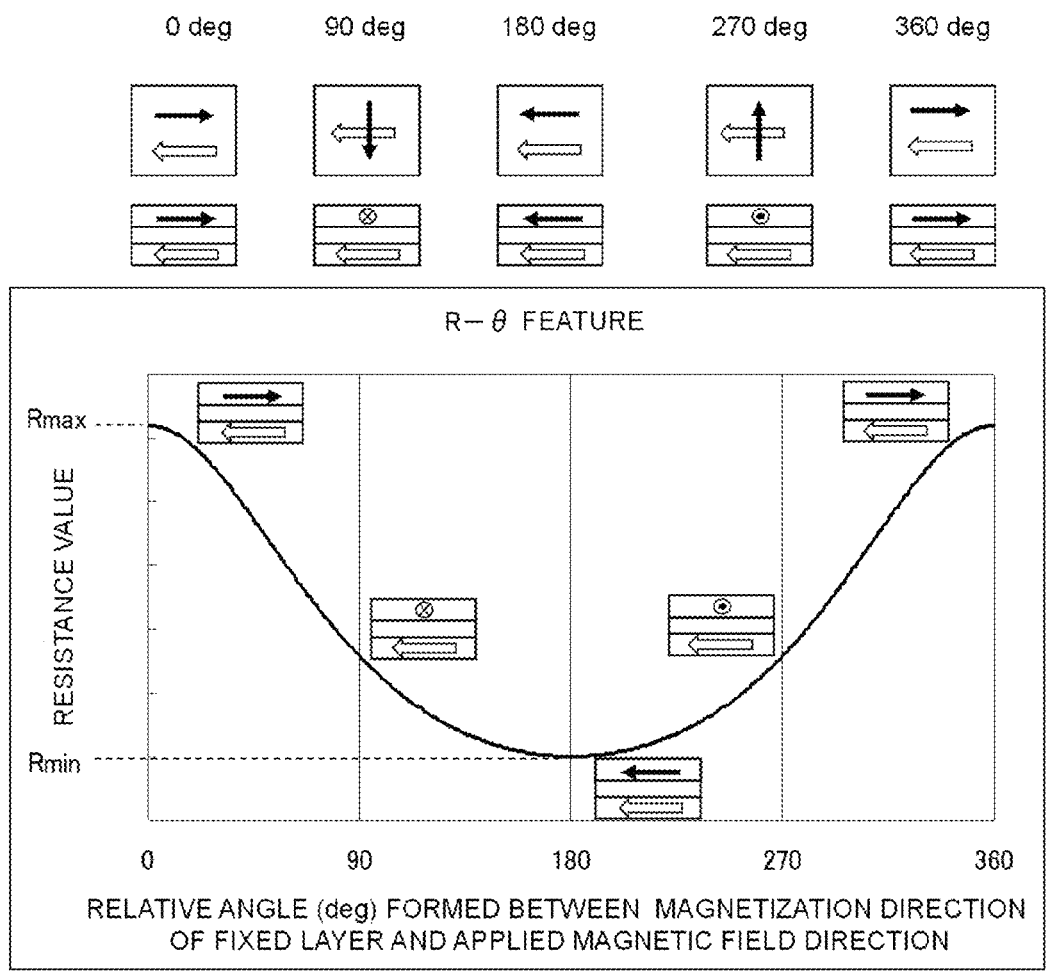
FIG. 32 is another view for explaining the characteristics of the magnetic detection element used for the present invention.
Figure 33:
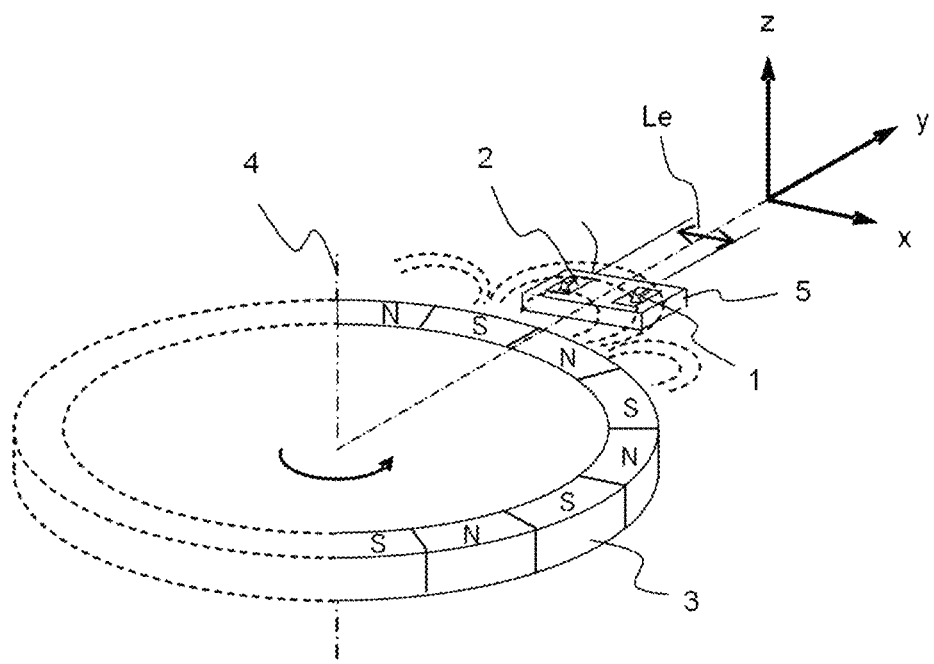
FIG. 33 is a perspective view showing a schematic configuration of a conventional magnetic detection device.
Figure 34:
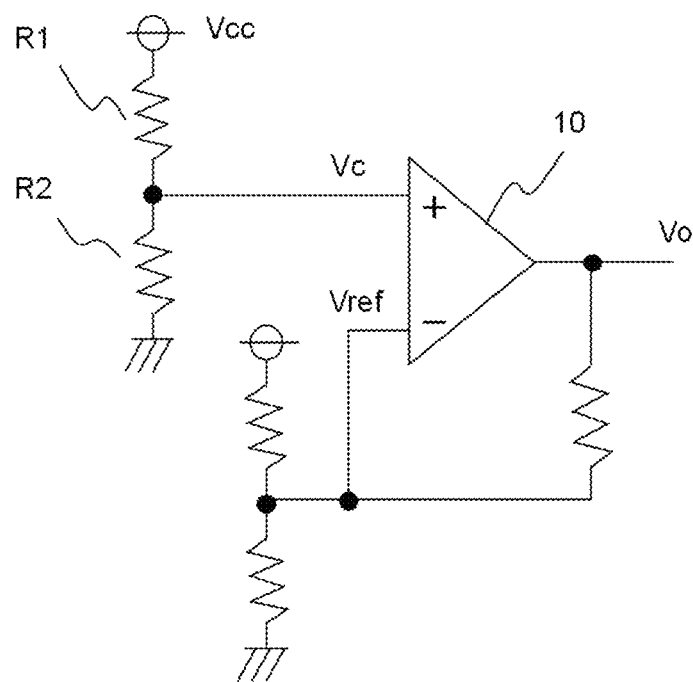
FIG. 34 is a circuit diagram showing an example of a signal processing circuit of the conventional magnetic detection device.
Figure 35:
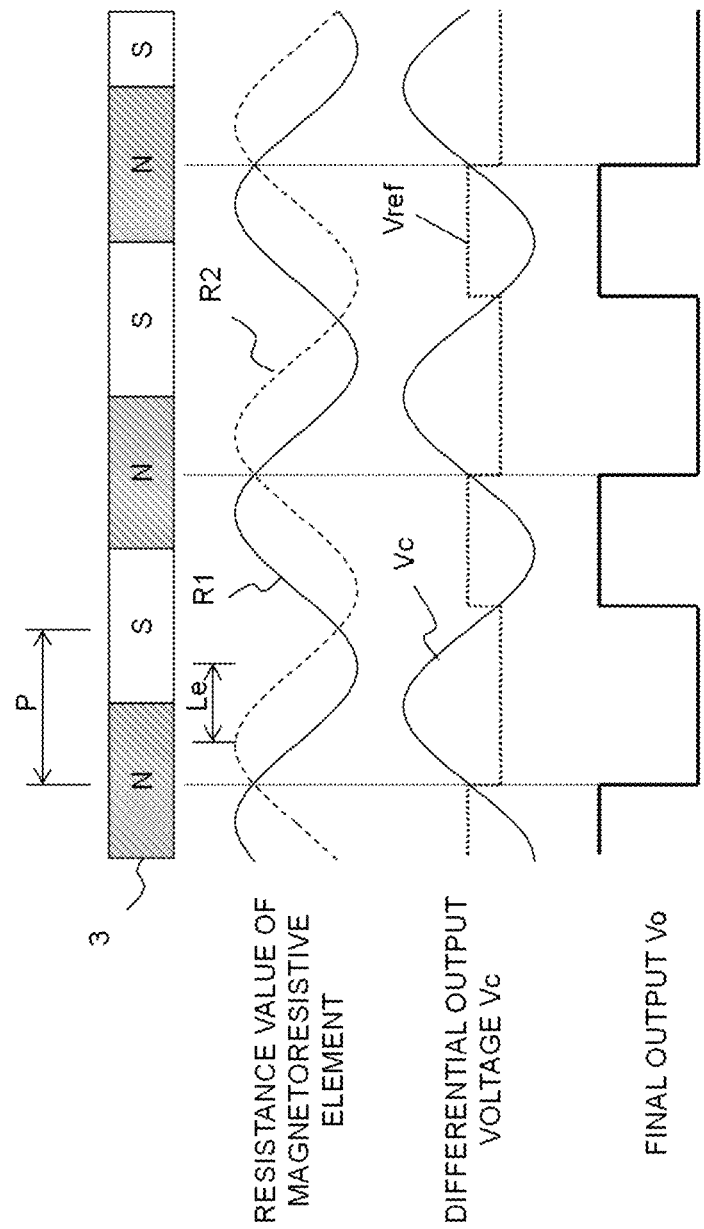
FIG. 35 is a view for explaining the operation of the conventional magnetic detection device.
Figure 36:
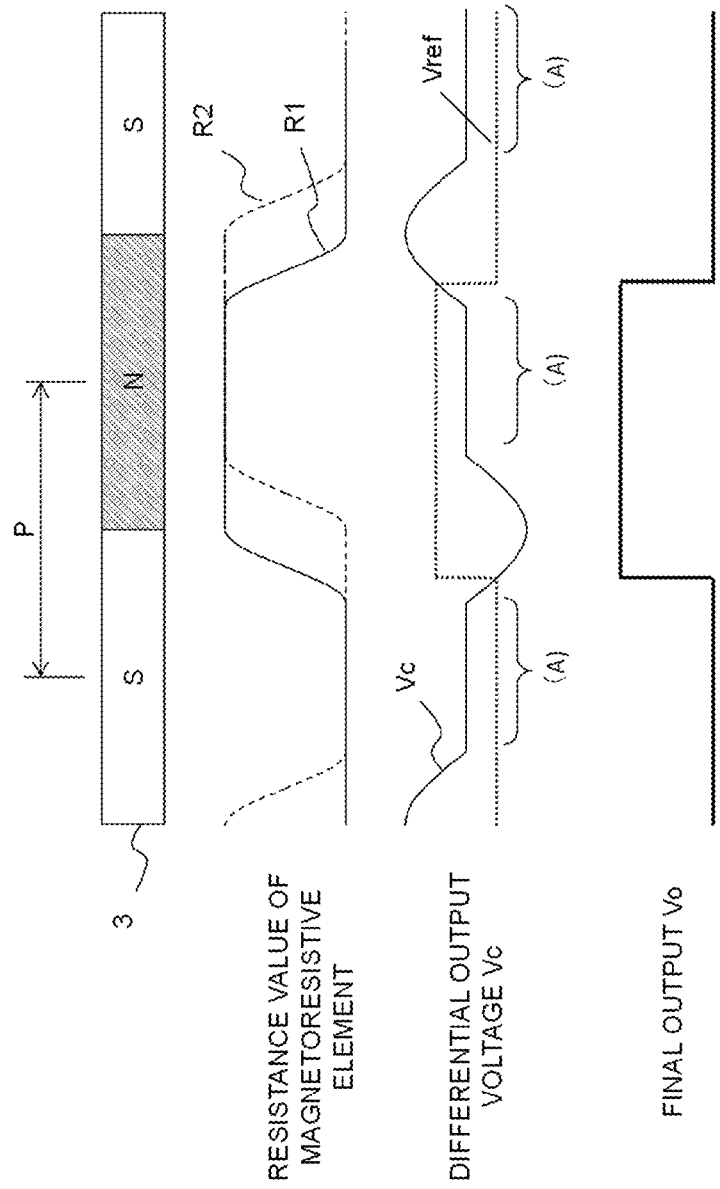
FIG. 36 is another view for explaining the operation of the conventional magnetic detection device.

FIG. 1 is a perspective view showing a schematic configuration of a magnetic detection device according to Embodiment 1 of the present invention; FIG. 2A and FIG. 2B each are a main-part enlarged view when viewed in a z-direction. A magnetic element 13 including a magnetoresistive element 11 and magnetoresistive element 12 is arranged in the proximity of the outer circumference of a magnetized rotor 14 that is magnetized alternately to a plurality of N and S poles along the outer circumference and rotates around a rotation shaft 15. The magnetic element 13 may be a circuit substrate mounted with the magnetoresistive elements 11 and 12 or an IC including the magnetoresistive elements 11 and 12 and a processing circuit. The magnetoresistive elements 11 and 12 each are, the same as that shown in FIG. 31, a magnetoresistive element in which a ferromagnetic layer, which is a fixed layer 6, whose magnetization direction is fixed and a ferromagnetic layer, which is a free layer 7, whose magnetization direction can be changed freely are formed with a non-magnetic middle layer 8 made of a non-magnetic material, such as a non-magnetic metal or insulator, sandwiched between the layers. A coordinate system is defined as follows: directions of the fixed layers of the magnetoresistive elements 11 and 12 are the x-axis; directions perpendicular to the x-axis and perpendicular to a plane including the fixed layers are the z-axis; and directions perpendicular to the x-z-plane are the y-axis. The magnetoresistive elements 11 and 12 are arranged in the proximity of the magnetized rotor 14 in the y-axis directions with respect to the outer circumferential surface thereof, maintaining a gap between the elements and the outer circumferential surface. The rotation shaft 15 of the magnetized rotor is nearly parallel to the x-axis; the outer circumferential surface of the magnetized rotor 14 moves nearly in parallel to the z-axis in the proximity of the magnetic element 13 when the rotation shaft 15 rotates.

As described above, the magnetoresistive elements 11 and 12 are arranged in such a way that the fixed layer plane, that is, a plane on which the fixed layers are formed, is in the x-y-plane, that is, a plane including the rotation shaft. In this embodiment 1, the magnetization directions of the fixed layers of the magnetoresistive elements 11 and 12 are parallel to the rotation shaft 15 and are the same direction. Moreover, the magnetoresistive elements 11 and 12 are arranged apart from each other by a predetermined distance in the directions parallel to the rotation shaft 15, on the same plane including the shaft. Furthermore, these two magnetoresistive elements 11 and 12 are arranged at two locations astride the y-z-plane F1 that bisects the thickness in the x-axis directions of the magnetized rotor 14. The distance L11 from F1 to the magnetoresistive element 11 and distance L12 from F1 to the magnetoresistive element 12 only have to be within a range of a magnetic field from the magnetized rotor existing. Explanation will be made in Embodiment 1, assuming a case of L11 and L12 being different from each other.

However, "being in a plane including the rotation shaft" described above does not mean the magnetoresistive elements need to be strictly in the plane, but the magnetoresistive elements only have to be arranged in directions enabling magnetic field components in directions along the plane including the rotation shaft to be detected without causing so large an error due to effects of magnetic field components in the directions perpendicular to the plane including the rotation shaft. As to other directions, the elements do not necessarily have to be arranged strictly in those directions as long as any large error does not occur. The same will apply to later explanations.

FIG. 2A shows by dashed arrows a magnetic field B from the magnetized rotor 14 when an N pole of the magnetized rotor 14 comes close to the magnetoresistive elements 11 and 12, while FIG. 2B shows when an S pole of the rotor comes close to the elements. The magnetic field B from the magnetized rotor 14 becomes nearly parallel to the y-axis on the plane F1 bisecting the thickness in the x-axis directions of the magnetized rotor 14. On the other hand, the magnetic field at a position distant from the plane F1 bisecting the thickness in the x-axis directions of the magnetized rotor 14 has components in the x-axis directions. Those magnetic field components from the magnetized rotor 14 in the x-axis directions become symmetrical with respect to the plane F1 bisecting the thickness in the x-axis directions of the magnetized rotor 14.

Figure 3:
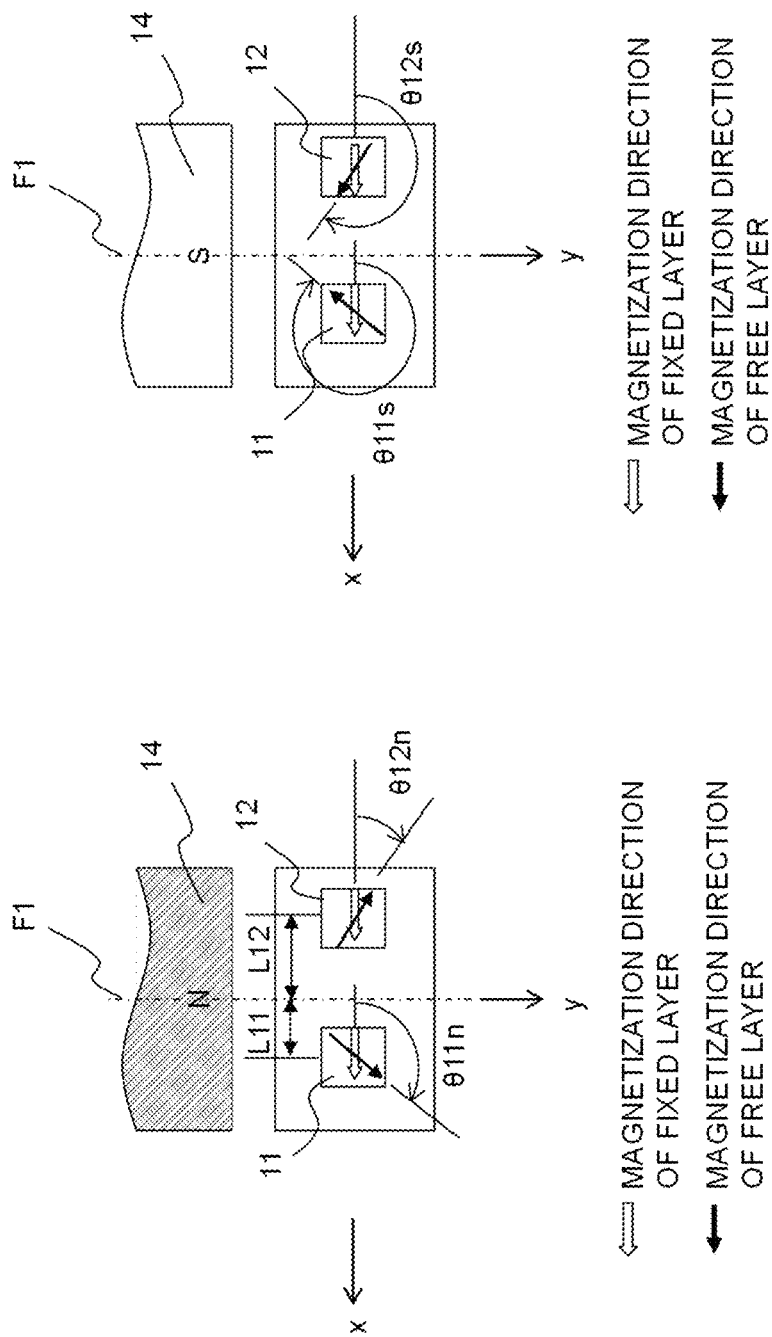
FIG. 3A and FIG. 3B are another main-part enlarged views for explaining states when the magnetoresistive elements come close to an N pole and an S pole of the magnetized rotor, respectively, in the magnetic detection device according to Embodiment 1 of the invention.

FIG. 3A shows magnetization directions of the fixed layers and free layers of the magnetoresistive elements 11 and 12 when an N pole of the magnetized rotor 14 comes close to those elements, while FIG. 3B shows when an S pole of the rotor comes close. Since the magnetization directions of the fixed layers represented by outlined arrows do not change depending on the applied magnetic field, the magnetization directions of both magnetoresistive elements 11 and 12 are parallel to the x-axis, that is, parallel to the rotation shaft 15 in both cases of FIG. 3A and FIG. 3B. Here, the magnetization direction of the fixed layer of the magnetoresistive element 11 and that of the fixed layer of the magnetoresistive element 12 are made the same direction. On the other hand, magnetization directions of the free layers represented by thick solid arrows change depending on the applied magnetic field and become directions along the applied magnetic field; therefore those magnetization directions are different between the magnetoresistive elements 11 and 12. Here, relative angles between the magnetization directions of the fixed layers and those of the free layers are defined as 0 degrees when the magnetization directions of the fixed layers and those of the free layers become antiparallel to each other. In FIG. 3A and FIG. 3B, when the N pole of the magnetized rotor 14 comes close to the magnetoresistive elements, the relative angles between the magnetization directions of the fixed layers and those of the free layers become θ11n in the magnetoresistive element 11 and θ12n in the magnetoresistive element 12, whereas when the S pole of the rotor comes close, the angles become θ11s in the magnetoresistive element 11 and θ12s in the magnetoresistive element 12.

Figure 4:
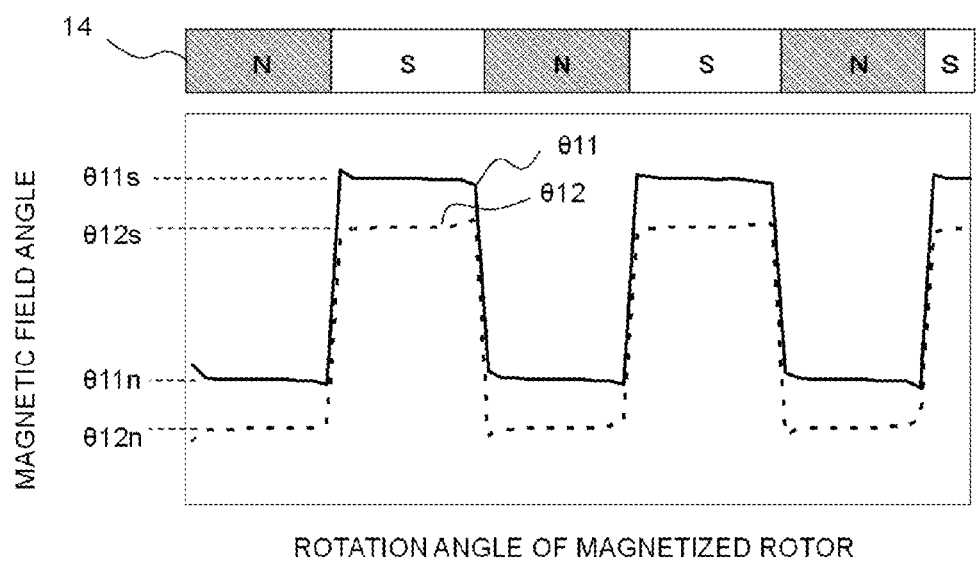
FIG. 4 is a view showing how a magnetic field changes depending on a rotation angle of the magnetized rotor of the magnetic detection device according to Embodiment 1 of the invention.
Figure 5:
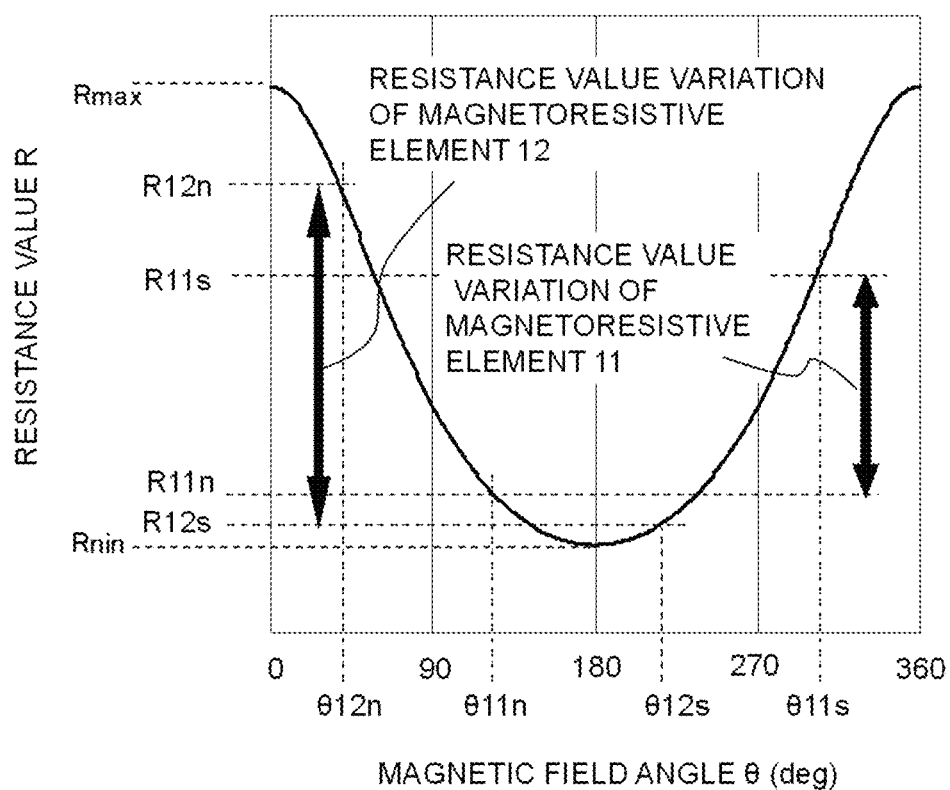
FIG. 5 is a view showing how the resistance values of the magnetoresistive elements vary depending on an applied magnetic field angle in the magnetic detection device according to Embodiment 1 of the invention.
Figure 6:
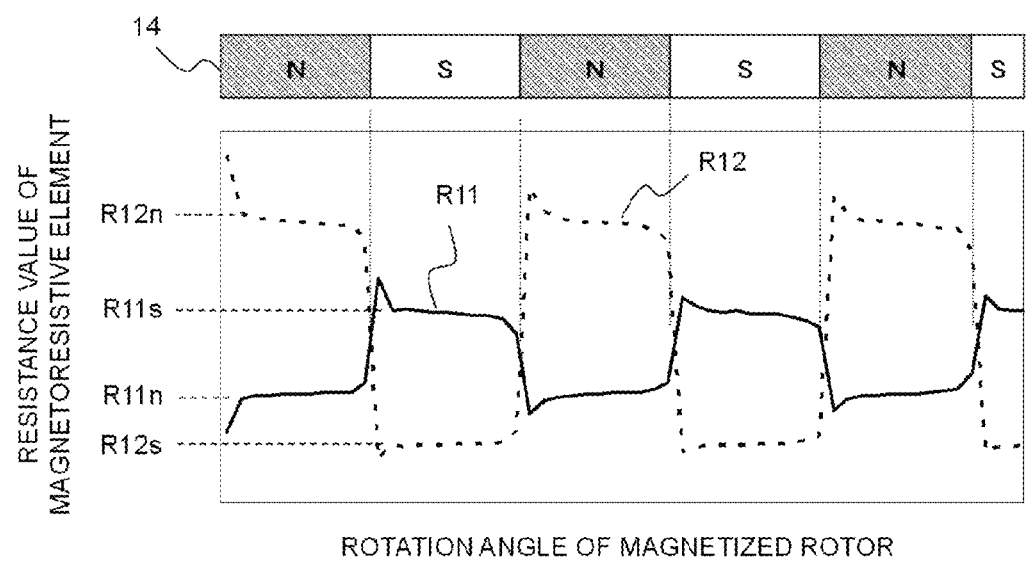
FIG. 6 is a view showing how the resistance values of the magnetoresistive elements vary depending on the rotation angle of the magnetized rotor of the magnetic detection device according to Embodiment 1 of the invention.

FIG. 4 shows how angles of the magnetic field applied to the magnetoresistive elements 11 and 12 with respect to the magnetization directions of the fixed layers (hereinafter referred to as magnetic field angles) change when the magnetized rotor 14 rotates. The magnetic field angle θ11 applied to the magnetoresistive element 11 and the magnetic field angle θ12 applied to the magnetoresistive element 12 change at boundaries between N and S poles of the magnetized rotor 14 coming close to the elements. Since the resistance values of the magnetoresistive elements vary with respect to the relative angles between the fixed layers and free layers (corresponding to the magnetic field angles) as shown in FIG. 5, the resistance value R11 of the magnetoresistive element 11 and resistance value R12 of the magnetoresistive element 12 vary as shown in FIG. 6 when the magnetized rotor 14 rotates. In FIG. 5 and FIG. 6, the suffix n represents when the magnetoresistive elements come close to an N pole, and the suffix s represents when the elements come close to an S pole.

In the magnetic field the magnetized rotor 14 generates, outgoing magnetic flux from N poles is the same as incoming flux to their neighboring S poles; therefore the magnetic field angles applied to the magnetoresistive elements are given as follows:

$$\theta xxs \approx \theta xxn + 180 \text{ degrees,}$$

where xx represents the reference numerals of the magnetoresistive elements, that is 11 or 12, and n represents when an N pole coming close and s represents when an S pole coming close.

Since the magnetoresistive elements 11 and 12 demonstrate symmetrical changes in resistance values with respect to a 180-degree relative angle between the magnetization directions of the fixed layers and free layers, resistance variation widths of the magnetoresistive elements 11 and 12 become wider. Signals from the magnetoresistive elements 11 and 12 are processed by the circuit shown in FIG. 7. That is to say, the magnetoresistive elements 11 (resistor R11) and magnetoresistive element 12 (resistor R12) are connected in series between a source voltage of Vcc of the circuit and ground, a voltage of Vc at the connecting point of both elements (referred to as differential output voltage) is applied to the non-inverting input of a differential amplifier 10, and a reference voltage of Vref to the inverting input thereof, so as to obtain a final output of Vo from the differential amplifier 10. Hysteresis is provided by feeding back the final output Vo to the inverting input of the differential amplifier 10.

Figure 8:
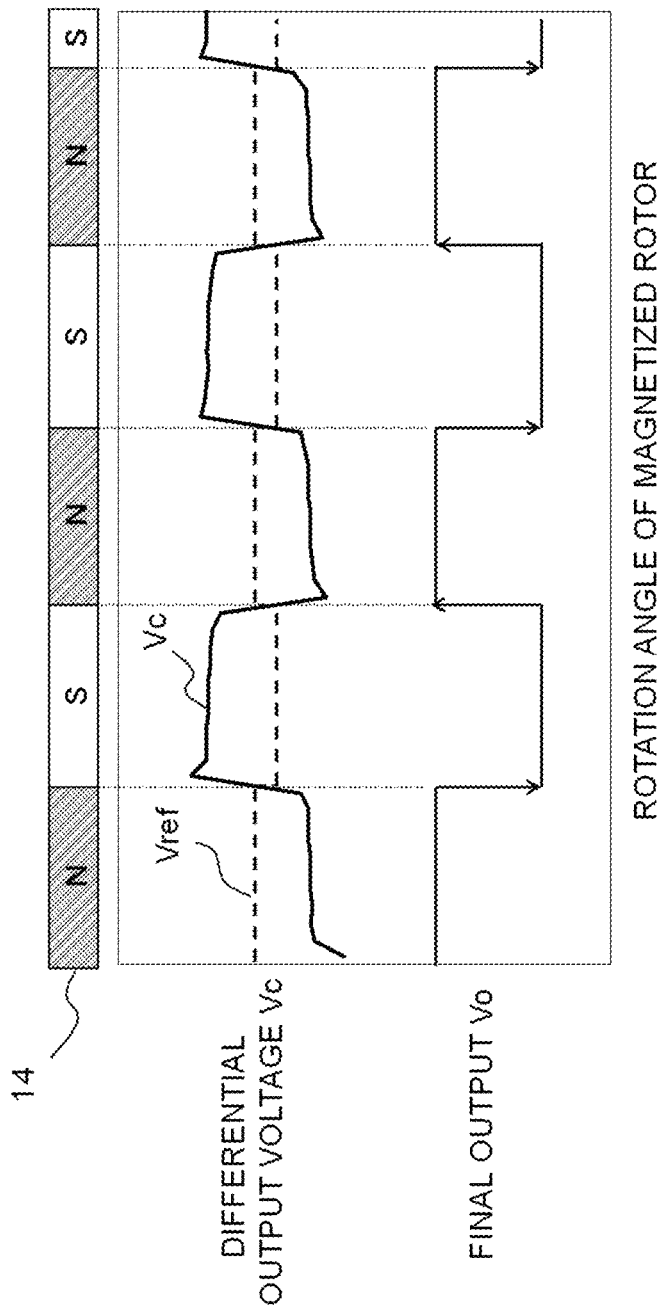
FIG. 8 is a view showing the operation of the signal processing circuit shown in FIG. 7 of the magnetic detection device according to Embodiment 1 of the invention.

The differential output voltage Vc and final output Vo as shown in FIG. 8 can be obtained by this signal processing circuit, with the magnetized rotor rotating. Since the differential output voltage Vc sharply varies at boundaries between N and S poles, shifts in the positions of signal rising and falling edges of the final output Vo will be smaller, so that the rotation of the magnetized rotor 14 can be detected in a highly accurate manner.

Moreover, according to Embodiment 1 of the present invention, directions of arranging the magnetoresistive elements (x-axis directions) are different from moving directions of the magnetized rotor (z-axis directions), which therefore enables highly accurate detection without depending on the magnetic pole pitch of the magnetized rotor.

A detection method as described in Embodiment 1 is suited to detecting rotation of a magnetized rotor, particularly such as one fixed to an engine camshaft, which is provided with a small number of magnetic poles per rotation of the rotor and whose magnetic pole pitch is relatively long.

Embodiment 2

Figures 9A, 9B:
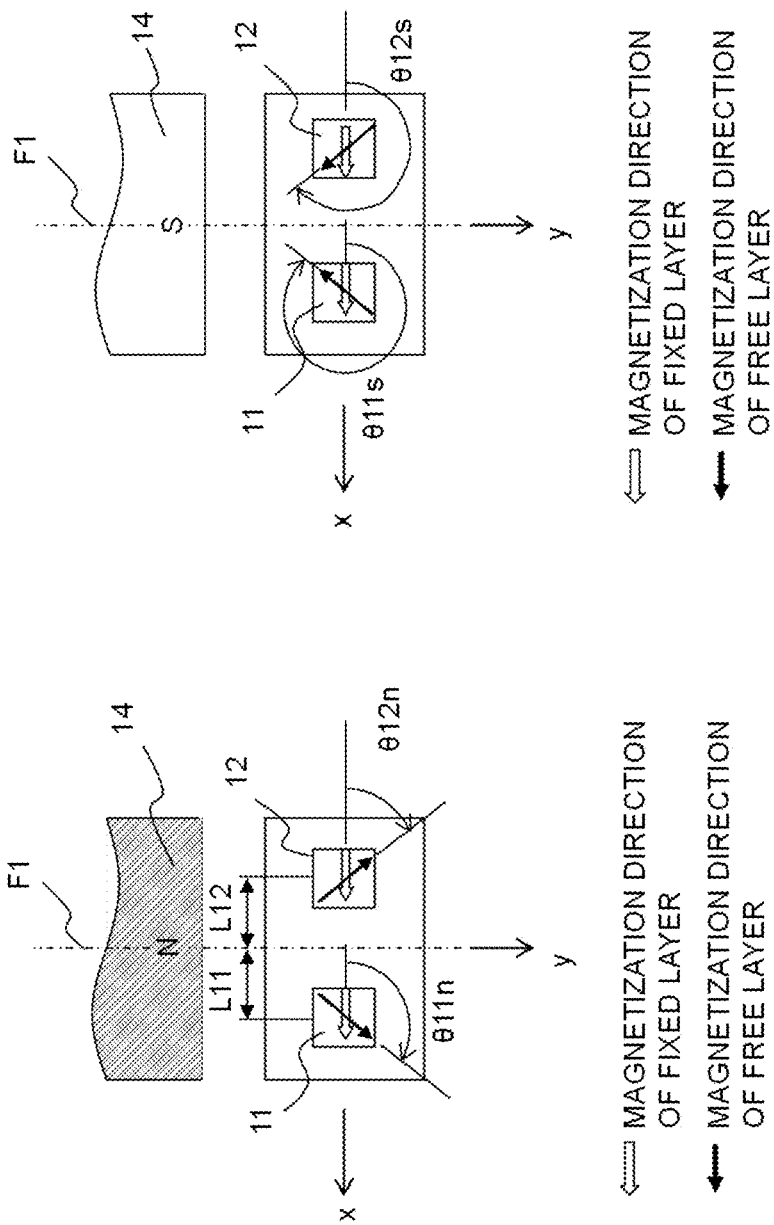
FIG. 9A and FIG. 9B are enlarged views for explaining states when magnetoresistive elements come close to an N pole and an S pole of a magnetized rotor, respectively, in a magnetic detection device according to Embodiment 2 of the invention.

FIG. 9A and FIG. 9B each are a main-part enlarged view of a magnetic detection device according to Embodiment 2 of the present invention, which corresponds to FIG. 2A and FIG. 2B shown in Embodiment 1. In this Embodiment 2, the magnetoresistive element 11 and magnetoresistive element 12 are arranged symmetrically with respect to the y-z-plane F1 bisecting the thickness in the x-axis directions of the magnetized rotor. That is to say, the magnetoresistive elements 11 and 12 are arranged in such a way that the distance L11 from F1 to the center of the magnetoresistive element 11 is the same as the distance L12 from F1 to the center of the magnetoresistive element 12. By arranging the magnetoresistive elements 11 and symmetrically with respect to the y-z-plane F1 bisecting the thickness in the x-axis directions, the direction of the magnetic field applied to the magnetoresistive element 11 and that of the magnetic field applied to the magnetoresistive element 12 become symmetrical with respect to the y-axis. In addition, the magnetization direction of the fixed layer of the magnetoresistive element 11 and that of the fixed layer of the magnetoresistive element 12 are made the same, the same as Embodiment 1. The magnetoresistive elements demonstrate that the resistance values vary, with respect to relative angles between magnetization directions of the fixed layers and free layers, symmetrically with reference to the 180-degree relative angle.

Figure 10:
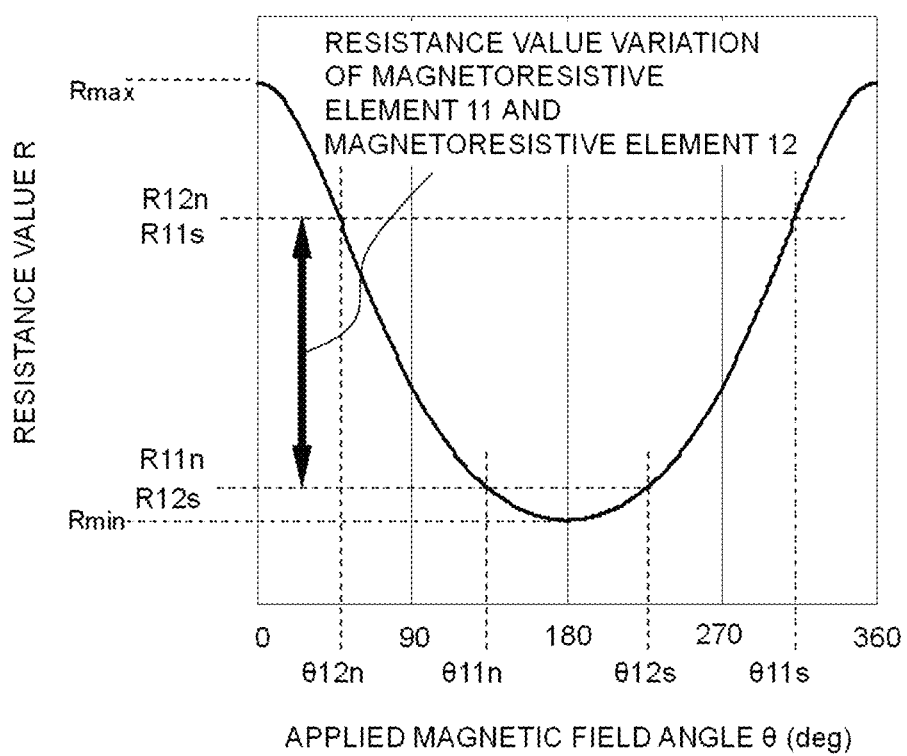
FIG. 10 is a view showing how the resistance values of the magnetoresistive elements vary depending on an applied magnetic field angle in the magnetic detection device according to Embodiment 2 of the invention.

Therefore, as shown in FIG. 10, given that the resistance values R11 and R12 of the magnetoresistive elements 11 and 12 are R11n and R12n, respectively, when the elements come close to an N pole as shown in FIG. 9A, and R11s and R12s, respectively, when the elements come close to an S pole as shown in FIG. 9B, the following equations are true $$R11n = R12s$$

$$R11s = R12n.$$

Even when the resistance values of the magnetoresistive elements 11 and 12 vary due to external factors such as temperature change, the resistance values of the magnetoresistive elements 11 and 12 vary in the same way. Therefore, when signals from the elements are processed by the signal processing circuit shown in FIG. 7, the amplitude center of the differential signal voltage does not vary, so by setting the voltage Vref in the signal processing circuit shown in FIG. 7 as $$Vref = Vcc/2,$$

rotation of the magnetized rotor 14 can be detected in a highly accurate manner.

Embodiment 3

Figure 11:
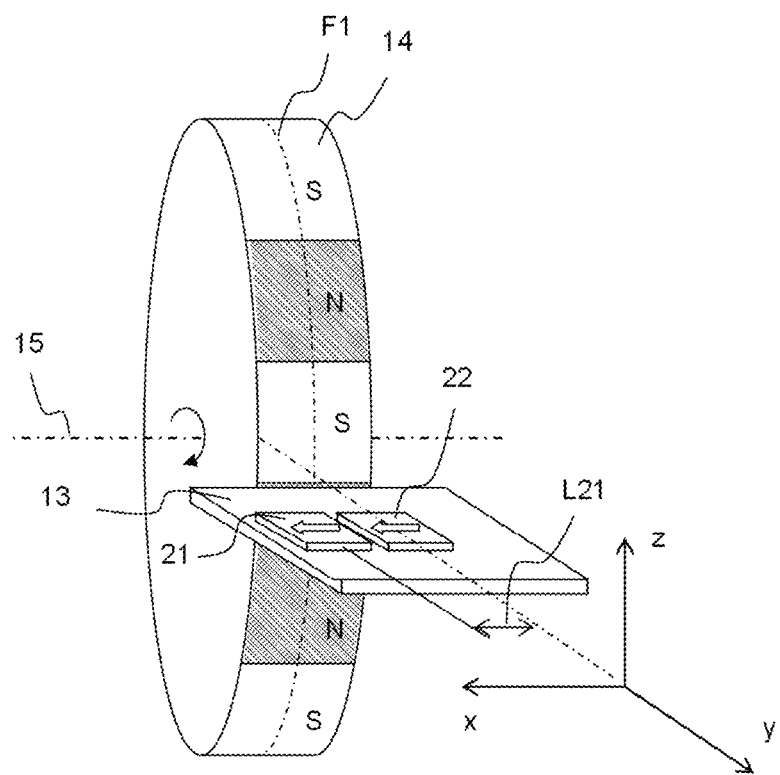
FIG. 11 is a perspective view showing a schematic configuration of a magnetic detection device according to Embodiment 3 of the invention.
Figures 12A, 12B:
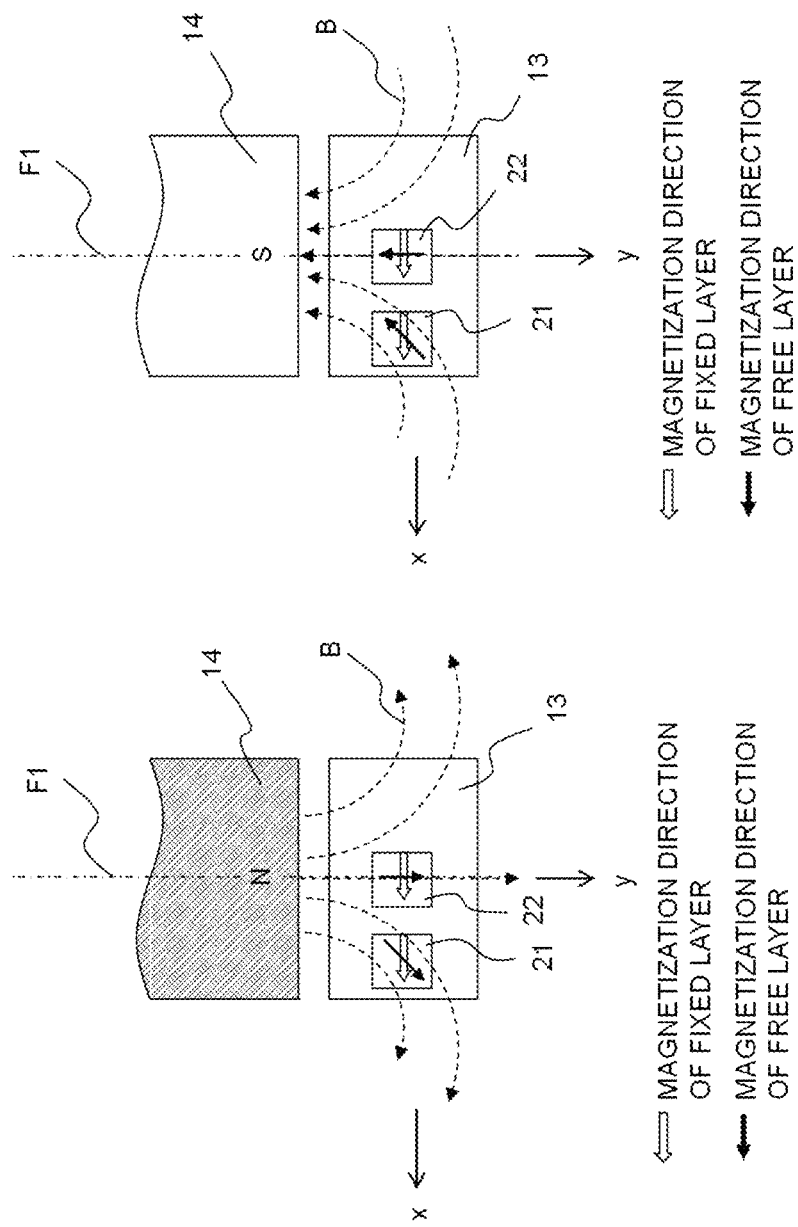
FIG. 12A and FIG. 12B are main-part enlarged views for explaining states when magnetoresistive elements come close to an N pole and an S pole of a magnetized rotor, respectively, in the magnetic detection device according to Embodiment 3 of the invention.

FIG. 11 is a perspective view showing a schematic configuration of a magnetic detection device according to Embodiment 3 of the present invention; FIG. 12A and FIG. 12B each are a main-part enlarged view when viewed in a z-direction. A coordinate system is defined as follows: directions of fixed layers of magnetoresistive elements 21 and 22 are the x-axis; directions perpendicular to the x-axis and perpendicular to the plane of the fixed layers, the z-axis; and directions perpendicular to the x-z-plane, the y-axis. The magnetoresistive element 21 and magnetoresistive element 22 are arranged close to the outer circumferential surface of the magnetized rotor 14 in the y-axis directions, maintaining a gap between the elements and the outer circumferential surface. The rotation shaft 15 of the magnetized rotor 14 is nearly parallel to the x-axis; the outer circumferential surface of the magnetized rotor 14 moves nearly in parallel to the z-axis in the proximity of the magnetoresistive elements 21 and 22, with the rotation shaft 15 rotating. The center of the magnetoresistive element 22 is located at a position where the plane F1 bisecting the thickness in the x-axis directions of the magnetized rotor 14 intersects the x-y-plane. The magnetoresistive element 21 is arranged in such a way that the element is on the same plane as the magnetoresistive element 22 and the distance between the center of the magnetoresistive element 21 and that of the magnetoresistive element 22 becomes L21 in the x-axis directions. In this Embodiment 3 described above, the same as Embodiments 1 and 2, the magnetoresistive elements 21 and 22 are also arranged in such a way that the plane on which the fixed layers are formed is in the x-y-plane, that is, a plane including the rotation shaft 15. Moreover, the magnetization directions of the fixed layers of the magnetoresistive elements 21 and 22 are parallel to the rotation shaft and are the same direction. Furthermore, the magnetoresistive elements 21 and 22 are arranged on the same plane including the rotation shaft 15, apart from each other by a predetermined distance in the directions parallel to the shaft.

FIG. 12A shows a magnetic field from the magnetized rotor 14 when an N pole of the magnetized rotor 14 comes close to the magnetoresistive elements 21 and 22, while FIG. 12B shows the magnetic field from the rotor when an S pole comes close to the elements. FIG. 13A shows magnetization directions of the fixed layers and free layers of the magnetoresistive elements 21 and 22 when the N pole of the magnetized rotor 14 comes close to those elements, while FIG. 13B shows the magnetization directions thereof when the S pole comes close.

Since the magnetization directions of the fixed layers do not change depending on the applied magnetic field, the magnetization directions of both magnetoresistive elements 21 and 22 are parallel to the x-axis whichever pole, the N pole or S pole, comes close to the elements. On the other hand, the magnetization directions of the free layers change depending on the applied magnetic field and become parallel to the directions of the applied magnetic field, so the magnetization directions are different between the magnetoresistive elements 11 and 12. Here, relative angles between the magnetization directions of the fixed layers and those of the free layers are defined as 0 degrees when the magnetization directions of the fixed layers and those of the free layers become antiparallel to each other. When the N pole of the magnetized rotor 14 comes close to the magnetoresistive elements, the relative angles between the magnetization directions of the fixed layers and those of the free layers become $\theta 21n$ in the magnetoresistive element 21 and $\theta 22\,n$ in the magnetoresistive element 22; whereas when the S pole of the rotor comes close, the angles become $\theta 21s$ in the magnetoresistive element 21 and $\theta 22\,s$ in the magnetoresistive element 22. The magnetoresistive element 22 is located at the position where the y-z-plane F1 bisecting the thickness in the x-axis directions of the magnetized rotor 14 intersects the x-y-plane; therefore, when the N pole of the magnetized rotor 14 comes close to the element, the magnetic field with a relative angle of $\theta 22n=90$ degrees with respect to the fixed layer of the magnetoresistive element 22 is applied; whereas when the S pole comes close, that with a relative angle of $\theta 22s=270$ degrees is applied.

Figure 14:
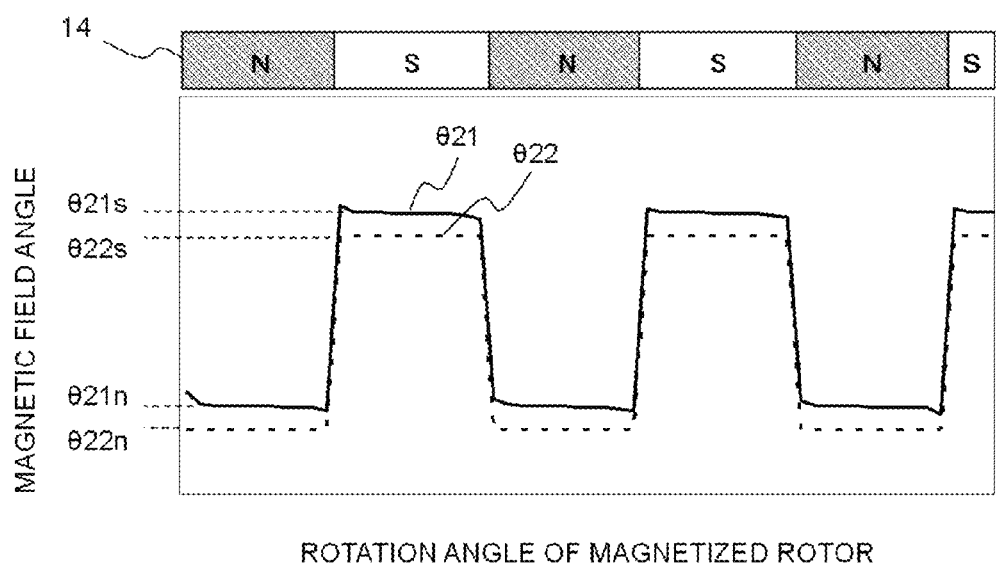
FIG. 14 is a view showing how a magnetic field changes depending on a rotation angle of the magnetized rotor of the magnetic detection device according to Embodiment 3 of the invention.

FIG. 14 shows how the magnetic field angle $\theta 21$ applied to the magnetoresistive element 21 and the magnetic field angle $\theta 22$ applied to the magnetoresistive element 22 change when the magnetized rotor 14 rotates. These magnetic field angles applied to the magnetoresistive elements 21 and 22 change at boundaries between N and S poles of the magnetized rotor 14 coming close to the elements.

Figure 15:
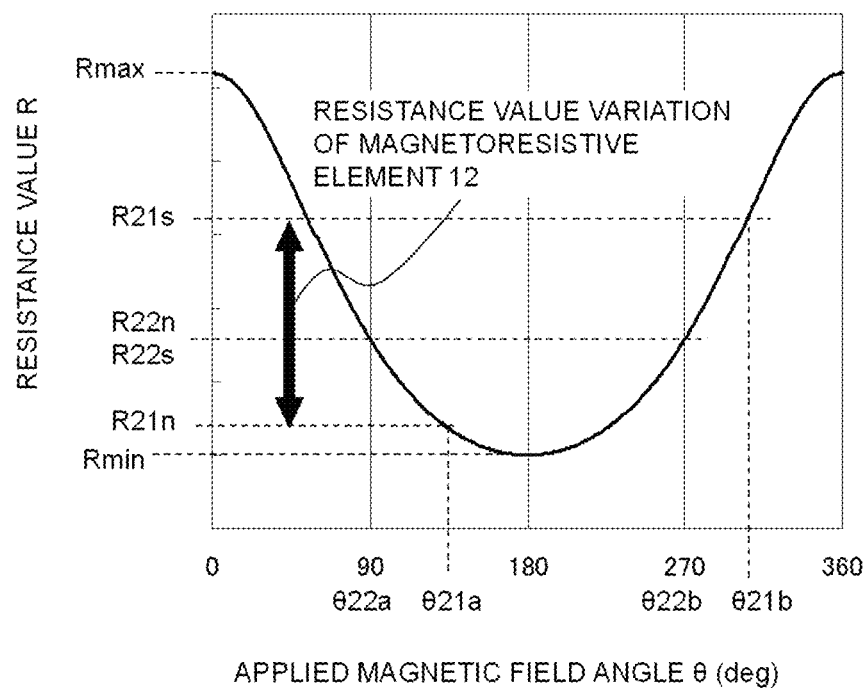
FIG. 15 is a view showing how the resistance values of the magnetoresistive elements vary depending on an applied magnetic field angle in the magnetic detection device according to Embodiment 3 of the invention.
Figure 16:
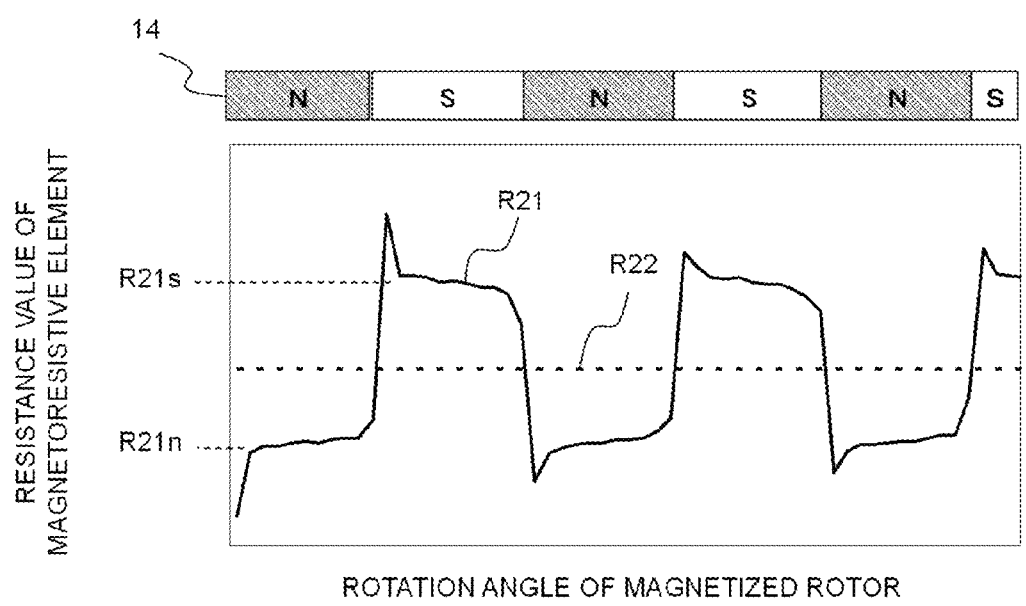
FIG. 16 is a view showing how the resistance values of the magnetoresistive elements vary depending on the rotation angle of the magnetized rotor of the magnetic detection device according to Embodiment 3 of the invention.
Figure 17:
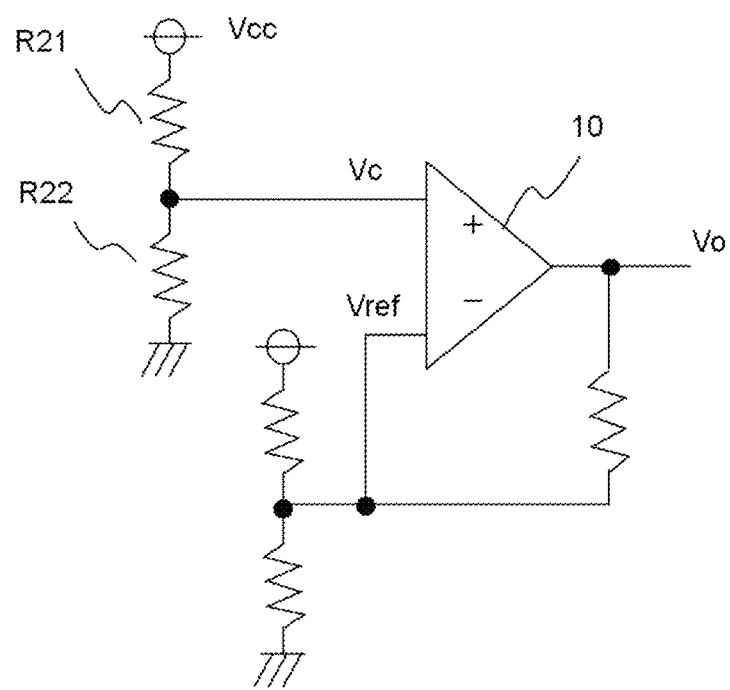
FIG. 17 is a circuit diagram showing an example of a signal processing circuit of the magnetic detection device according to Embodiment 3 of the invention.
Figure 18:
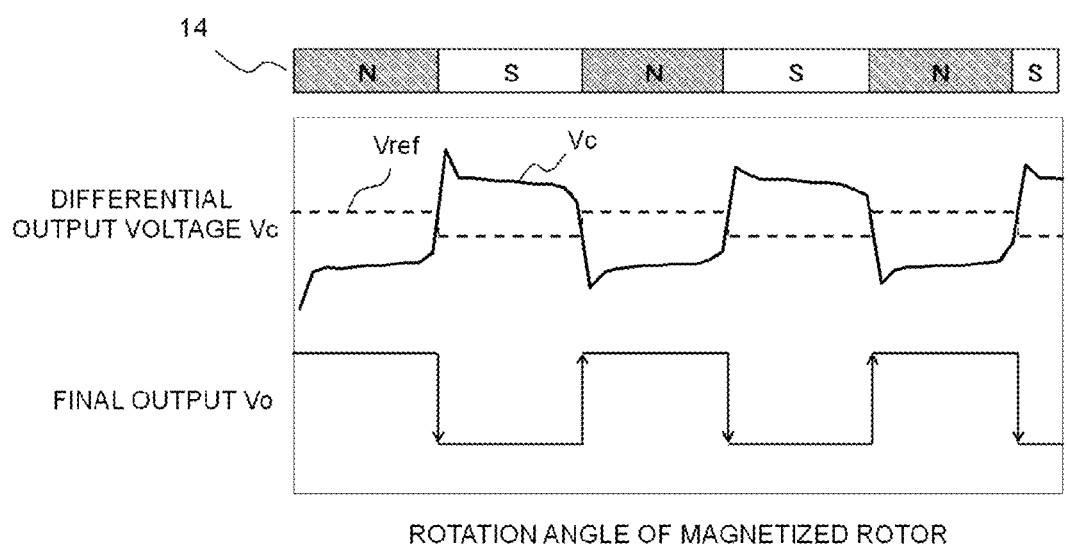
FIG. 18 is a view showing the operation of the signal processing circuit shown in FIG. 17 of the magnetic detection device according to Embodiment 3 of the invention.

The resistance values of the magnetoresistive elements vary, as shown in FIG. 15, with respect to the relative angles between the fixed layers and free layers; therefore, when the magnetized rotor 14 rotates, the resistance value R22 of the magnetoresistive element 22 does not vary, but only the resistance value R21 of the magnetoresistive element 21 varies as shown in FIG. 16. Signals from the magnetoresistive elements are processed by the circuit shown in FIG. 17, whereby the differential output voltage Vc and final output Vo can be obtained as shown in FIG. 18. As a result, rotation of magnetized rotor 14 can be detected in a highly accurate manner in Embodiment 3 as well, the same as in Embodiment 1.

Moreover, according to this Embodiment 3, the distance L21 between the magnetoresistive elements can be shortened, so that the circuit substrate or IC can be reduced in size, thereby enabling reduction in the magnetic detection device costs. Furthermore, the resistance value of the magnetoresistive element 22 does not vary as shown in FIG. 16. Therefore, even if the magnetoresistive element 22 is not provided but only the magnetoresistive element 21 is provided and R22 is replaced with a fixed resistor in the signal processing circuit of FIG. 17, the final output Vo shown in FIG. 18 can be obtained. However, if temperature change and other factors are taken into consideration, providing the magnetoresistive element 22 would help to obtain a more accurate magnetic detection device.

Embodiment 4

Since the magnetoresistive elements demonstrate, as shown in FIG. 5 and others, variations in resistance values with respect to the relative angles between the fixed layers and free layers, the more the directions of the magnetic field applied to the magnetoresistive elements are parallel or antiparallel to the magnetization directions of the fixed layers, the greater the variations in resistance values become. Embodiment described hereinafter is the one for making the directions of the magnetic field applied to the magnetoresistive elements more parallel or antiparallel to the magnetization directions of the fixed layers.

Figure 19:
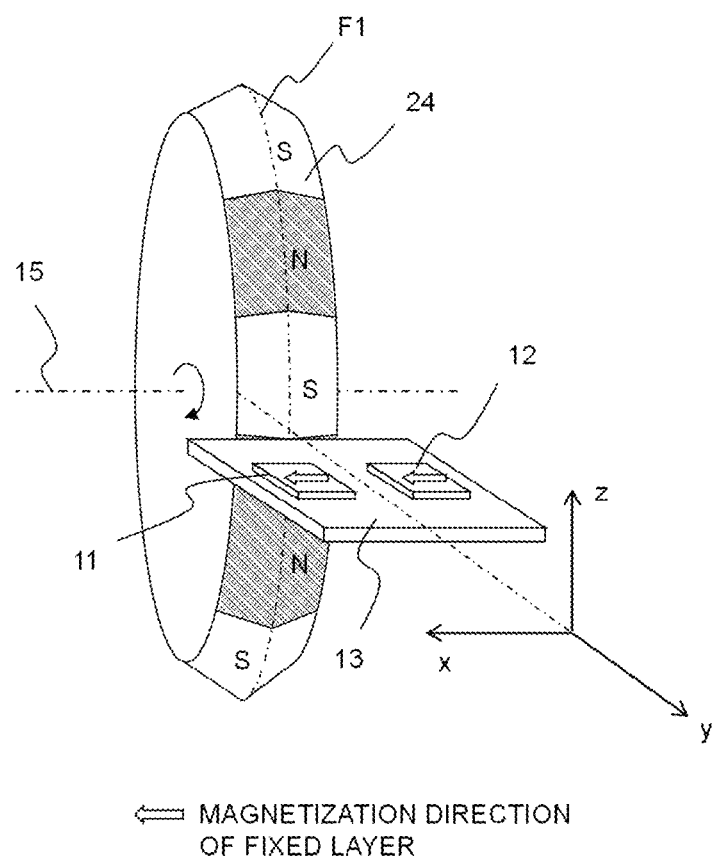
FIG. 19 is a perspective view showing a schematic configuration of a magnetic detection device according to Embodiment 4 of the invention.
Figure 20A:
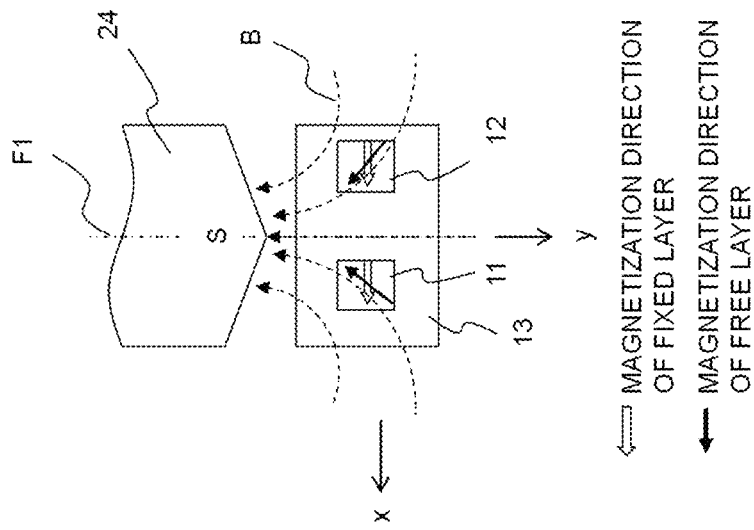
FIG. 20A and FIG. 20B are an enlarged view for explaining a state when magnetoresistive elements come close to an N pole and an S pole of a magnetized rotor, respectively, in the magnetic detection device according to Embodiment 4 of the invention.
Figure 20B:
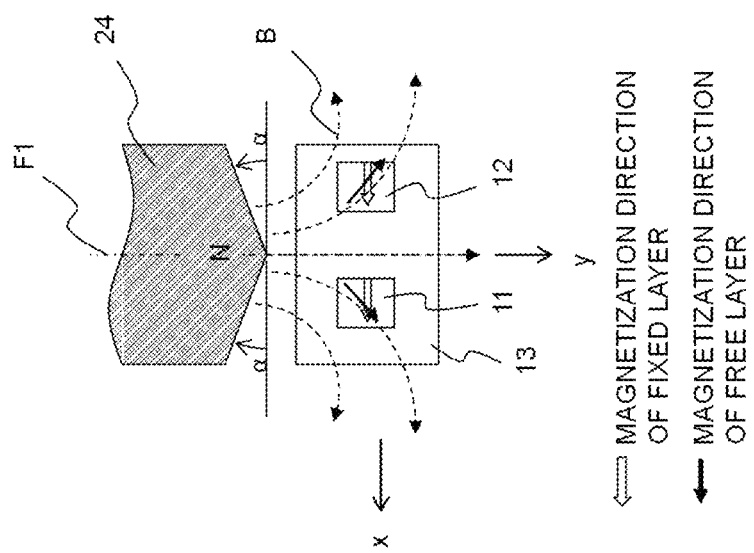

FIG. 19 is a perspective view showing a schematic configuration of a magnetic detection device according to Embodiment 4 of the present invention; FIG. 20A and FIG. 20B each are an enlarged view when viewed in a z-direction. A coordinate system is defined as follows: directions of the fixed layers of the magnetoresistive elements 11 and 12 are the x-axis; directions perpendicular to the x-axis and perpendicular to the plane of the fixed layers, the z-axis; and directions perpendicular to the x-z-plane, the y-axis. The magnetoresistive elements 11 and 12 are arranged close in the y-axis-directions to the outer circumferential surface of a magnetized rotor 24 that is magnetized alternately to a plurality of N and S poles, maintaining a gap between the elements and the outer circumferential surface of the rotor. The rotation shaft 15 of the magnetized rotor 24 is nearly parallel to the x-axis; the outer circumferential surface of the magnetized rotor 24 moves nearly in parallel to the z-axis in the proximity of the magnetoresistive elements 11 and 12 when the rotation shaft 15 rotates. The magnetoresistive element 11 and magnetoresistive element 12 are arranged at two locations astride the y-z-plane F1 bisecting the thickness in the x-axis directions of the magnetized rotor 24. The outer circumferential surface of the magnetized rotor 24 is tilted at an angle of α, compared to a case without the tilt, symmetrically with respect to the y-z-plane F1 bisecting the thickness in the x-axis directions of the magnetized rotor 24. By tilting the outer circumference of the magnetized rotor 24, the directions of magnetic flux lines outside the outer circumferential surface of the magnetized rotor change from those of magnetic flux lines outside the outer circumference of any magnetized rotors according to Embodiments 1 to 3, so that magnetic field components in the x-axis directions will increase.

Figures 21A, 21B:
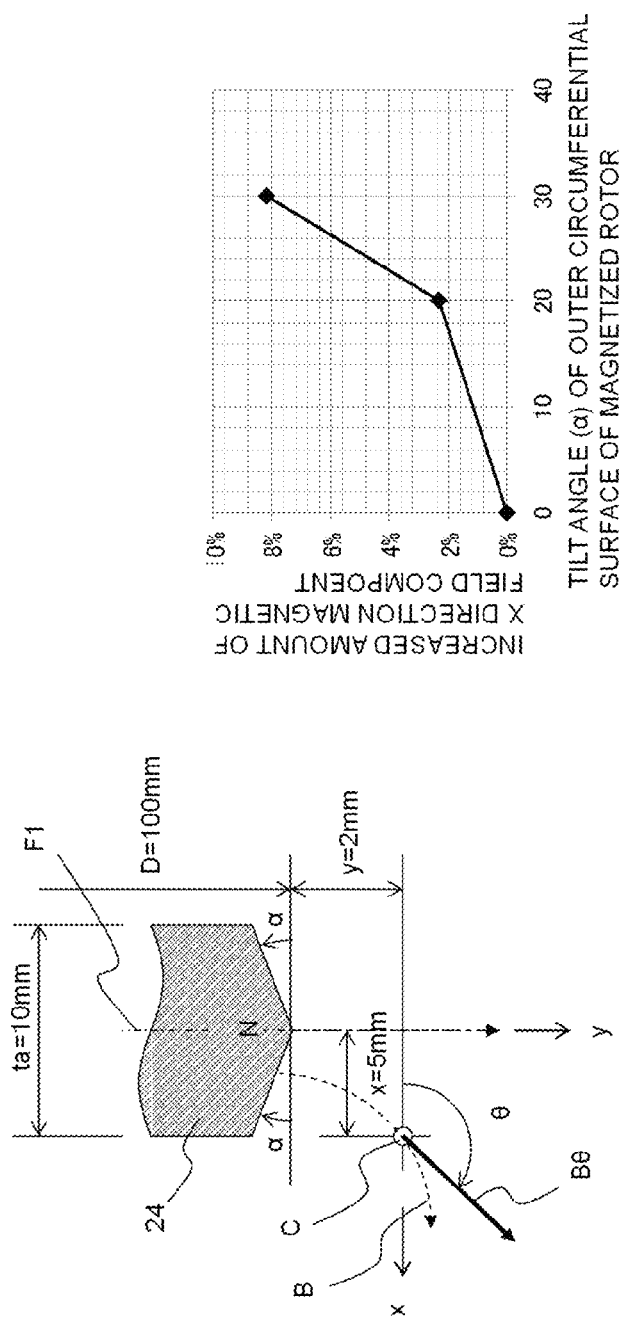
FIG. 21A and FIG. 21B each are views for explaining the operation of the magnetic detection device according to Embodiment 4 of the invention.

Here is shown an example of calculation as to how the magnetic field components in the x-axis directions change. As the calculation example, the magnetized rotor 24 as shown in FIG. 21A is considered, which has a diameter D of 100 mm and a thickness to of 10 mm and is made of ferrite, as a magnetic material, with 60 N and S poles arranged alternately. The magnetic field components in the x-axis directions at a point C that is 2-mm distant from the apex of the magnetized rotor 24 and 5-mm distant from the plane F1 have been calculated, letting the tilt angle α be 0, 20 and 30 degrees. FIG. 21B shows how the magnetic field components in the x-axis directions increase from those at α=0, that is, the case without the tilt. As shown in FIG. 21B, when the outer circumference of the magnetized rotor is tilted at the angle of 30 degrees, the magnetic field components in the x-axis directions at the point C will increase around 8% compared to the case with no tilt provided.

Figure 7:
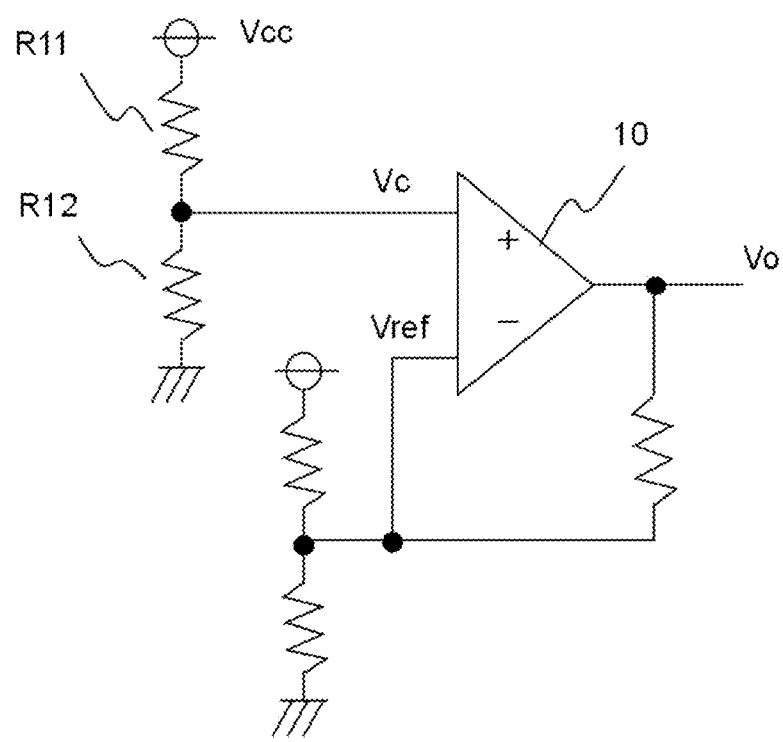
FIG. 7 is a circuit diagram showing an example of a signal processing circuit of the magnetic detection device according to Embodiment 1 of the invention.

When the magnetic field the magnetized rotor 24 generates is detected by the magnetoresistive elements 11 and 12 and signals from those elements are processed by a signal-processing circuit similar to that in FIG. 7, a differential signal voltage can be obtained that is larger than that obtained without the tilt on the outer circumference of the magnetized rotor. Therefore, shifts in the positions of signal rising and falling edges of the final output will be reduced, so that rotation of the magnetized rotor 24 can be detected in a highly accurate manner.

Additionally, the shape of the outer circumferential surface of the magnetized rotor 24 only has to be symmetrical with respect to the y-z-plane F1 bisecting the thickness in the x-axis directions, so even if the surface is shaped in an arc, for example, the same effect can be produced. That is to say, the outer circumferential surface of the magnetized rotor 24 only has to be formed in a chevron shape, symmetrically with respect to the plane F1 bisecting the thickness in the x-axis directions of the rotor, with the apex located at the position where the outer circumferential surface intersects the plane F1.

In FIG. 19, FIG. 20A and FIG. 20B, the magnetoresistive elements 11 and 12 are arranged, the same as explained in Embodiment 2, symmetrically with respect to the y-z-plane F1 bisecting the thickness in the x-axis directions of the magnetized rotor 24, whereby the directions of the magnetic field applied to the magnetoresistive elements 11 and 12 become symmetrical with respect to the y-axis. The same as Embodiment 2 explained above, the resistance value R11 of the magnetoresistive element 11 and resistance value R12 of the magnetoresistive element 12 become $R11n=R12s$ $R11s=R12n.$ Even when the resistance values of the magnetoresistive elements 11 and 12 vary due to external factors such as temperature change, the amplitude center of the differential signal voltage does not vary. By setting the voltage Vref of the signal processing circuit in FIG. 7 as $Vref=Vcc/2,$ the rotation of the magnetized rotor 24 can be detected in a highly accurate manner.

Embodiment 5

Figure 22:
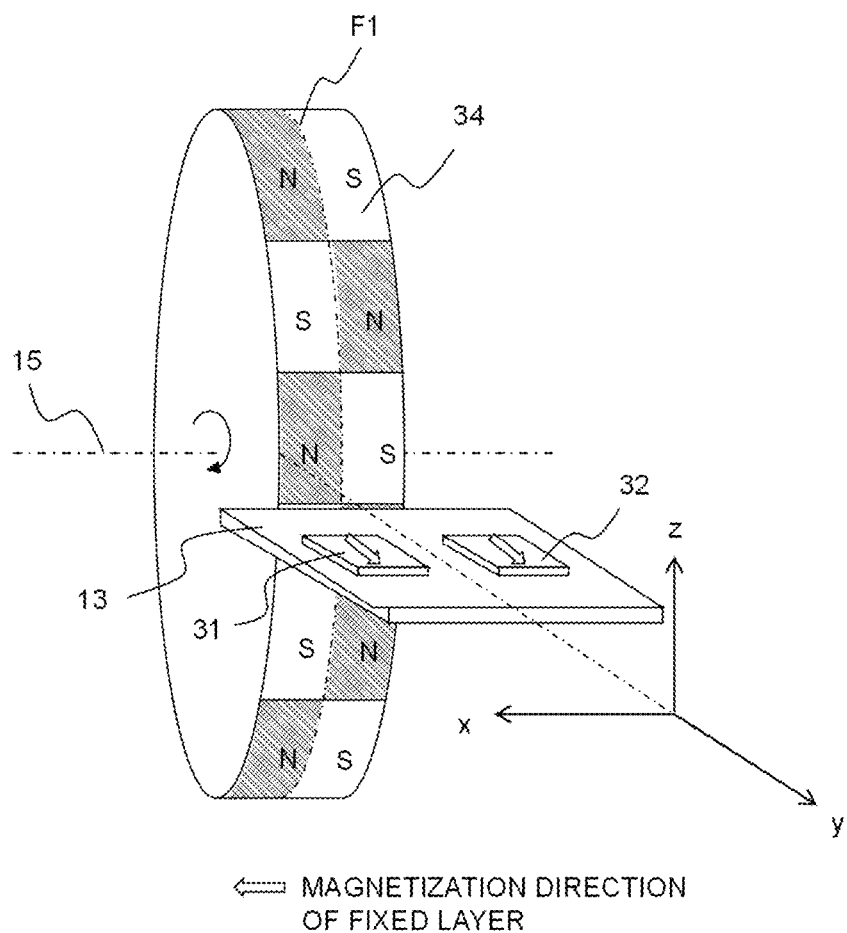
FIG. 22 is a perspective view showing a schematic configuration of a magnetic detection device according to Embodiment 5 of the invention.
Figure 23:
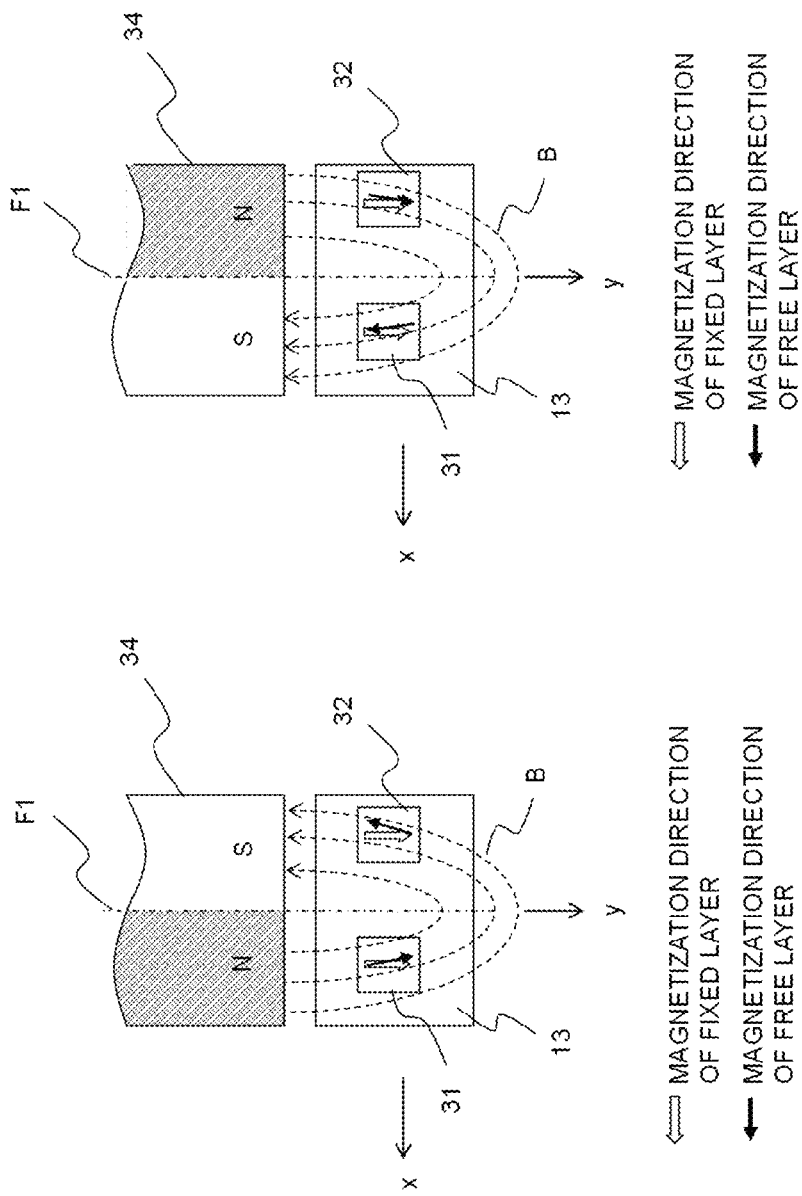
FIG. 23A and FIG. 23B are enlarged views for explaining states when one of the magnetoresistive elements comes close to an N pole and an S pole of a magnetized rotor, respectively, in the magnetic detection device according to Embodiment 5 of the invention.

FIG. 22 is a perspective view showing a schematic configuration of a magnetic detection device according to Embodiment 5 of the present invention; FIG. 23A and FIG. 23B each are an enlarged view when viewed in a z-direction. As shown in FIG. 22, a coordinate system is defined as follows: magnetization directions of fixed layers of magnetoresistive elements 31 and 32 are the y-axis; directions perpendicular to the y-axis and perpendicular to the plane of the fixed layers, the z-axis; and directions perpendicular to the y-z-plane, x-axis. The magnetoresistive elements 31 and 32 are arranged close to the outer circumferential surface of a magnetized rotor 34 in the y-axis directions, maintaining a gap between the elements and the outer circumferential surface. The rotation shaft 15 of the magnetized rotor 34 is nearly parallel to the x-axis; the outer circumferential surface of the magnetized rotor 34 moves nearly in parallel to the z-axis in the proximity of the magnetoresistive elements 31 and 32 when the rotation shaft 15 rotates. The magnetoresistive element 31 and magnetoresistive element 32 are arranged at two locations astride the y-z-plane F1 bisecting the thickness in the x-axis directions of the magnetized rotor 34. The outer circumference of the magnetized rotor is magnetized alternately to N and S poles in a circumferential direction, and also magnetized to different magnetic poles from each other with respect to the y-z-plane F1 bisecting the thickness in the x-axis directions of the magnetized rotor 34. As described above, the magnetoresistive elements 31 and 32 are arranged in such a way that the plane on which the fixed layers thereof are formed is in the x-y-plane, that is, a plane including the rotation shaft. In this embodiment 5, the magnetization directions of the fixed layers of the magnetoresistive elements 31 and 32 are perpendicular to the rotation shaft 15 and are the same direction. Moreover, the magnetoresistive elements 31 and 32 are arranged on the same plane including the rotation shaft 15, apart from each other by a predetermined distance in the directions parallel to the shaft.

FIG. 23A shows a magnetic field B from the magnetized rotor 34 when an N pole of the magnetized rotor 34 comes close to the magnetoresistive element 31, while FIG. 23B shows the magnetic field B when an S pole of the rotor comes close to the magnetoresistive element 31. In FIG. 23A, magnetic flux lines from the N pole of the magnetized rotor 34 close to the magnetoresistive element 31 head toward an S pole thereof close to the magnetoresistive element 32. Therefore, the direction of the magnetic field applied to the magnetoresistive element 31 is nearly parallel to the magnetization direction of the fixed layer of the element, and the direction of the magnetic field applied to the magnetoresistive element 32 is nearly antiparallel to the magnetization direction of the fixed layer thereof.

On the other hand, in FIG. 23B, the magnetic flux lines head from an N pole of the magnetized rotor 34 close to the magnetoresistive element 32 toward the S pole close to the magnetoresistive element 31; therefore, the direction of the magnetic field applied to the magnetoresistive element 31 is nearly antiparallel to the magnetization direction of the fixed layer of the element, while that of the magnetic field applied to the magnetoresistive element 32 is nearly parallel to the magnetization direction of the fixed layer thereof.

Figure 24:
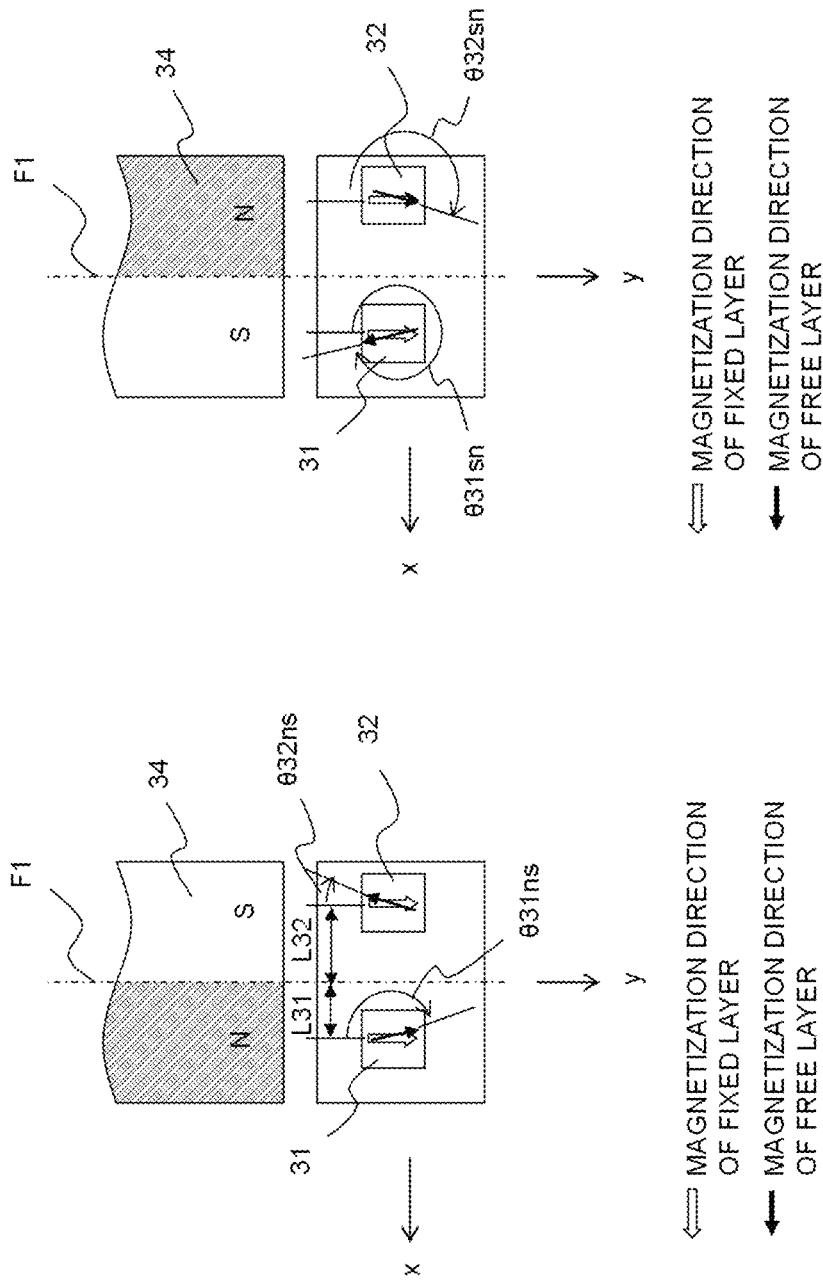
FIG. 24A and FIG. 24B are another enlarged views for explaining states when one of the magnetoresistive elements comes close to an N pole and an S pole of the magnetized rotor, respectively, in the magnetic detection device according to Embodiment 5 of the invention.

FIG. 24A shows magnetization directions of the fixed layers and free layers of the magnetoresistive elements 31 and 32 in a state in FIG. 23A, while FIG. 24B shows the magnetization directions of the fixed layers and free layers of the elements in a state in FIG. 23B. Since magnetization directions of the fixed layers do not change depending on the applied magnetic field, both magnetization directions of the fixed layers of the magnetoresistive elements 31 and 32 are parallel to the y-axis in both cases of FIG. 24A and FIG. 24B. On the other hand, since magnetization directions of the free layers change depending on the applied magnetic field and become parallel to the direction of the applied magnetic field, the magnetization directions are different between the magnetoresistive elements 31 and 32. The relative angles between the magnetization directions of the fixed layers and those of the free layers are defined as 0 degrees when the magnetization directions of the fixed layers and those of the free layers become antiparallel to each other. When the N pole of the magnetized rotor 34 comes close to the magnetoresistive element 31, the relative angles between the magnetization directions of the fixed layers and those of the free layers become θ31ns in the magnetoresistive element 31 and θ32ns in the magnetoresistive element 32; whereas when the S pole of the magnetized rotor 34 comes close, the angles become θ31sn in the magnetoresistive element 31 and θ32sn in the magnetoresistive element 32.

Figure 25:
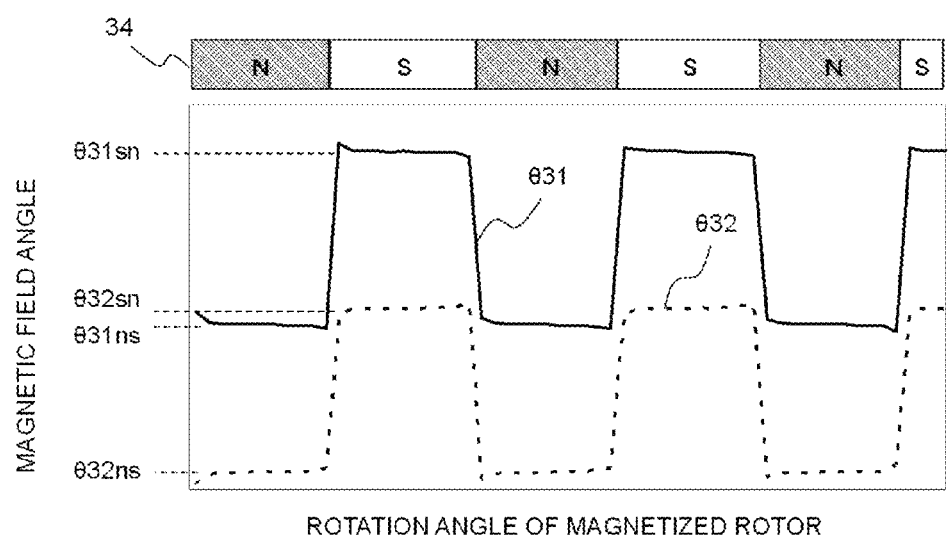
FIG. 25 is a view showing how a magnetic field changes depending on a rotation angle of the magnetized rotor of the magnetic detection device according to Embodiment 5 of the invention.

FIG. 25 shows how the magnetic field angle θ31 applied to the magnetoresistive element 31 and magnetic field angle θ32 applied to the magnetoresistive element 32 change when the magnetized rotor 34 rotates. In the magnetized rotor 34 described in the figure, magnetic poles close to the magnetoresistive element 31 are shown. The magnetic field angles applied to the magnetoresistive elements 31 and 32 change at boundaries between N and S poles of the magnetized rotor 34 coming close to the elements.

Figure 26:
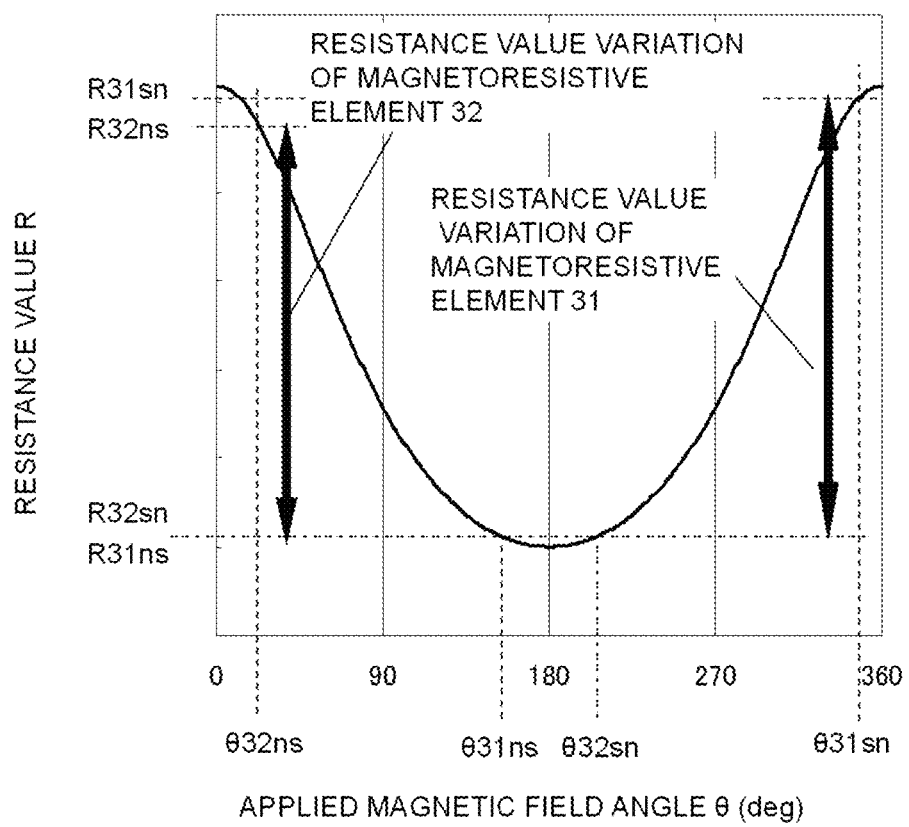
FIG. 26 is a view showing how the resistance values of the magnetoresistive elements vary depending on an applied magnetic field angle in the magnetic detection device according to Embodiment 5 of the invention.
Figure 27:
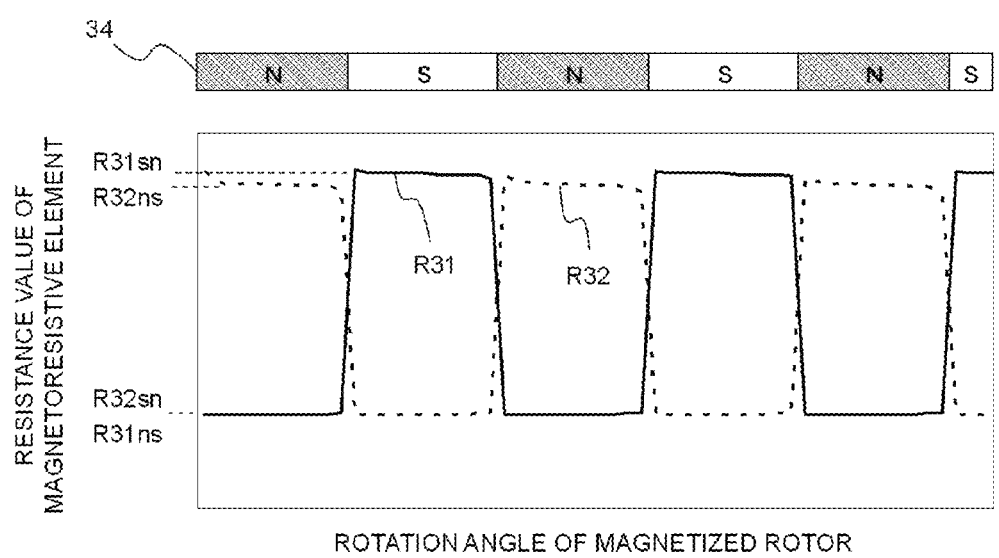
FIG. 27 is a view showing how the resistance values of the magnetoresistive elements vary depending on the rotation angle of the magnetized rotor of the magnetic detection device according to Embodiment 5 of the invention.

A magnetic field by which the relative angles between the magnetization directions of the fixed layers and free layers become nearly 180 degrees or 360 degrees (0 degrees) is applied to the magnetoresistive elements 31 and 32. The resistance value R31 of the magnetoresistive element 31 and resistance value R32 of the magnetoresistive element 32 vary significantly as shown in FIG. 27, attributed to the characteristics of the magnetoresistive elements shown in FIG. 26, when the magnetized rotor 34 rotates. Additionally, in FIG. 26 and FIG. 27, the resistance value of the magnetoresistive element 31 and that of the magnetoresistive element 32 are represented as R31ns and R32ns, respectively, when the magnetoresistive element 31 comes close to an N pole; whereas R31sn and R32sn, respectively, when the element comes close to an S pole.

Figure 28:
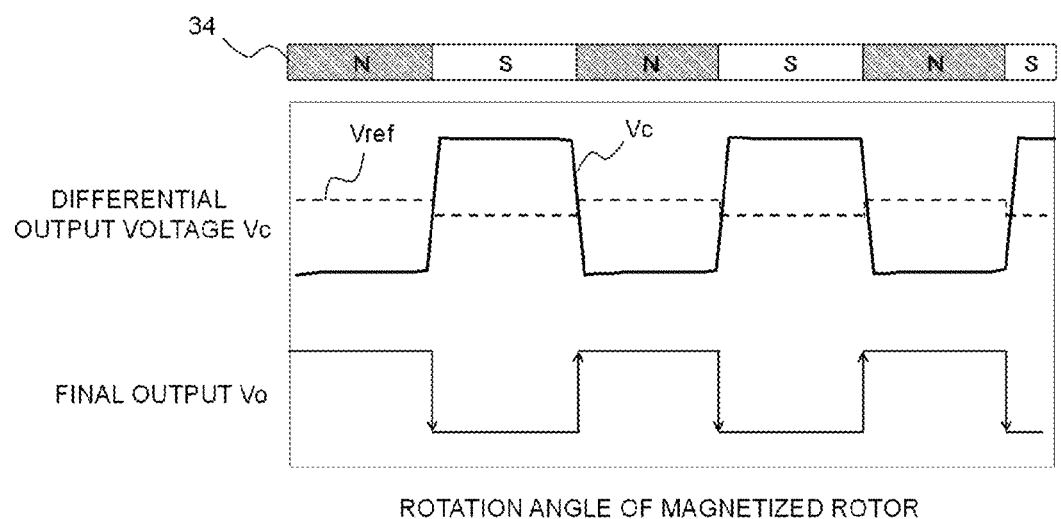
FIG. 28 is a view showing the operation of a signal processing circuit of the magnetic detection device according to Embodiment 5 of the invention.

By processing signals from the foregoing magnetoresistive elements by a circuit similar to that in FIG. 7, the differential output voltage Vc and final output Vo can be obtained as shown in FIG. 28. Since the differential output voltage Vc sharply varies at boundaries between N and S poles coming close to the elements, shifts in the positions of signal rising and falling edges of the final output Vo will be smaller, so that the rotation of the magnetized rotor 34 can be detected in a highly accurate manner.

Embodiment 6

Embodiment 6 is characterized in that the magnetoresistive elements in Embodiment 5 are arranged symmetrically with respect to the y-z-plane bisecting the thickness in the x-axis directions of the magnetized rotor. That is, the magnetoresistive elements 31 and 32 are arranged with L31 and L32 in FIG. 24A and FIG. 24B made equal to each other.

By arranging the magnetoresistive elements 31 and 32 symmetrically with respect to the y-z-plane F1 bisecting the thickness in the x-axis directions, the direction of the magnetic field applied to the magnetoresistive element 31 and that applied to the magnetoresistive element 32 become symmetrical with respect to the y-axis. Therefore, the resistance values of the magnetoresistive elements 31 and 32 are $R31ns=R32sn$ $R31sn=R32ns.$ Even when the resistance values of the magnetoresistive elements 31 and 32 vary due to external factors such as temperature change, the resistance values of the magnetoresistive elements 31 and 32 vary in the same way. Therefore, when the signal processing circuit shown in FIG. 7 performs signal processing, the amplitude center of the differential signal voltage does not vary. By setting the voltage Vref of the signal processing circuit shown in FIG. 7 as $Vref=Vcc/2,$ rotation of the magnetized rotor 34 can be detected in a highly accurate manner.

Embodiment 7

Figure 29:
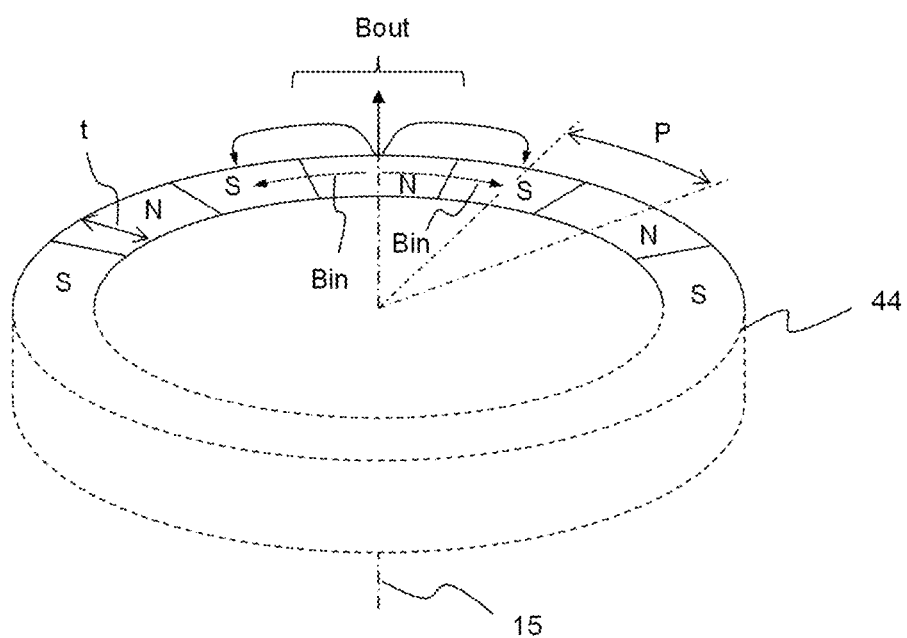
FIG. 29 is a perspective view showing a configuration of a magnetized rotor of a magnetic detection device according to Embodiment 6 of the invention.

FIG. 29 is a schematic view showing a magnetized rotor 44 of a magnetic detection device according to Embodiment 7 of the present invention. The magnetized rotor 44 is provided with a magnet section along the outer circumference thereof, which has a radial thickness of t and is magnetized alternately to N and S poles at the magnetic pole pitch P in a circumferential direction. Magnetic flux lines from N poles head toward their neighboring S poles.

Here, given that magnetic flux passing through inside the magnet section and that passing through outside the section are Bin and Bout, respectively, if the relationship between the magnetic pole pitch P and radial thickness t of the magnet section is set as $P/t>1,$ the surface area of the outer circumference of the magnetized rotor 44 becomes larger than the area where the N and S poles of the magnet section contact each other, out of areas through which the magnetic flux heading from the N poles toward the S poles passes; therefore $Bout>Bin.$ This magnetized rotor 44 is used as the magnetized rotor of each magnetic detection device according to Embodiments 1 to 6, whereby the magnetic field applied to the magnetoresistive elements increases, so that the capability of detecting rotation of the magnetized rotor can be enhanced.

As described above, a magnetic detection device according to Embodiment 7 of the present invention can detect the rotation of magnetized rotor in a highly accurate manner without depending on the magnetic pole pitch of the magnetized rotor, and in addition, the circuit substrate or IC can be reduced in size.

Embodiment 8

Figure 30:
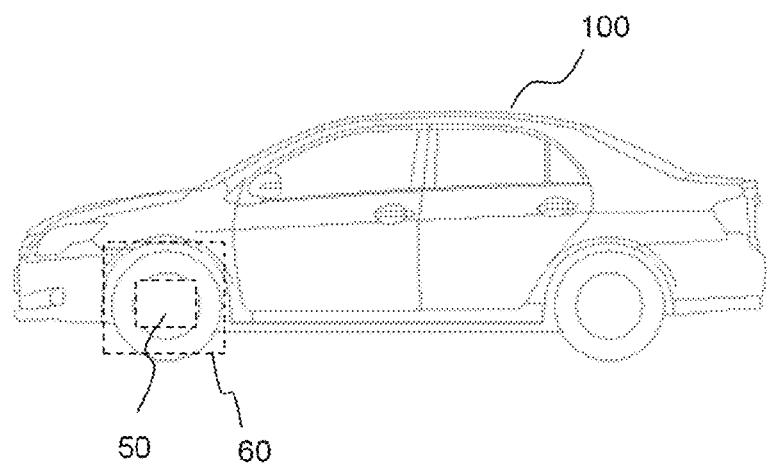
FIG. 30 is a conceptual diagram showing a construction of a vehicle equipped with an on-vehicle rotation detection device according to Embodiment 7 of the invention.

FIG. 30 is a schematic view showing a concept of an on-vehicle rotation detection device according to Embodiment 8 of the present invention. Any one of the magnetic detection devices according to the present invention explained in Embodiments 1 to 7 is mounted on a vehicle 100, as a magnetic detection device 50 shown in FIG. 30, in such a way that the rotation shaft of the magnetized rotor rotates with a rotation shaft of a rotating mechanism of the vehicle, such as an axle or engine crankshaft of the vehicle, thereby enabling this device to be used practically as an on-vehicle rotation detection device 60. The magnetic detection devices according to this invention can exert effects of compactness and highly accurate detection capability on the on-vehicle rotation detection device 60.

Additionally, free combinations of the embodiments of this invention, arbitral modifications and alterations of each embodiment and deletion of structural requirements thereof will be apparent to those skilled in the art, without departing from the scope and spirit of the invention.

What is claimed is:

1. A magnetic detection device including a magnetoresistive element that is formed of a fixed layer made of a ferromagnetic material whose magnetization direction is fixed and a free layer made of a ferromagnetic material whose magnetization direction can be freely changed, with a non-magnetic middle layer sandwiched between the layers, and arranged therein maintaining a gap between the element and an outer circumferential surface of a magnetized rotor in which N poles and S poles are alternately arranged along the outer circumference rotating around a rotation shaft, wherein the magnetoresistive element is arranged in such a way that a plane on which the fixed layer is formed is in a plane including the rotation shaft, wherein two magnetoresistive elements identical to the magnetoresistive element are arranged in a direction parallel to the rotation shaft, apart from each other by a predetermined distance, wherein magnetization directions of fixed layers of the two magnetoresistive elements are parallel to the rotation shaft and are in the same direction, and wherein a pitch P at which the N poles and the S poles are arranged alternately along the outer circumferential surface of the magnetized rotor is greater than a radial thickness t of a magnetized magnet section of the magnetized rotor.

2. A magnetic detection device according to claim 1, wherein the two magnetoresistive elements are arranged astride a plane bisecting the thickness of the magnetized rotor.

3. A magnetic detection device according to claim 2, wherein the two magnetoresistive elements are arranged at the same distance from the plane bisecting the thickness of the magnetized rotor.

4. A magnetic detection device according to claim 2, wherein the outer circumferential surface of the magnetized rotor is formed in a chevron shape symmetrical with respect to the plane bisecting the thickness of the magnetized rotor, with its apex located where the outer circumferential surface intersects the plane bisecting the thickness of the magnetized rotor.

5. An on-vehicle rotation detection device, wherein a magnetic detection device according to claim 1 is mounted on a vehicle in such a way that the rotation shaft of the magnetized rotor rotates with a rotation shaft of a rotating mechanism of the vehicle.

6. A magnetic detection device including a magnetoresistive element that is formed of a fixed layer made of a ferromagnetic material whose magnetization direction is fixed and a free layer made of a ferromagnetic material whose magnetization direction can be freely changed, with a non-magnetic middle layer sandwiched between the layers, and arranged therein maintaining a gap between the element and an outer circumferential surface of a magnetized rotor in which N poles and S poles are alternately arranged along the outer circumference rotating around a rotation shaft, wherein the magnetoresistive element is arranged in such a way that a plane on which the fixed layer is formed is in a plane including the rotation shaft, wherein two magnetoresistive elements identical to the magnetoresistive element are arranged in a direction parallel to the rotation shaft, apart from each other by a predetermined distance, wherein the two magnetoresistive elements are arranged astride a plane bisecting the thickness of the magnetized rotor, wherein magnetic poles different from each other in both sides of the plane bisecting the thickness of the magnetized rotor are arranged along the outer circumference of the magnetized rotor, and magnetization directions of fixed layers of the two magnetoresistive elements are perpendicular to the rotation shaft and are in the same direction, and wherein a pitch P at which the N poles and the S poles are arranged alternately along the outer circumferential surface of the magnetized rotor is greater than a radial thickness t of a magnetized magnet section of the magnetized rotor.

* * * * *